United States Patent [19]
Takeuchi

[11] Patent Number: 5,766,997
[45] Date of Patent: Jun. 16, 1998

[54] METHOD OF FORMING FLOATING GATE TYPE NON-VOLATILE SEMICONDUCTOR MEMORY DEVICE HAVING SILICIDED SOURCE AND DRAIN REGIONS

[75] Inventor: Nobuyoshi Takeuchi, Tokyo, Japan

[73] Assignee: NKK Corporation, Tokyo, Japan

[21] Appl. No.: 721,938

[22] Filed: Sep. 27, 1996

[30] Foreign Application Priority Data

Nov. 30, 1909 [JP] Japan ................... 7-311781
Sep. 28, 1995 [JP] Japan ................... 7-250967
Nov. 27, 1995 [JP] Japan ................... 7-307206
Jan. 26, 1996 [JP] Japan ................... 8-011828

[51] Int. Cl.⁶ .................................... H01L 21/8247
[52] U.S. Cl. .................... 438/257; 438/664; 438/683
[58] Field of Search .......................... 438/257, 260, 438/262, 263, 264, 303, 583, 649, 655, 656, 664, 683

[56] References Cited

U.S. PATENT DOCUMENTS

| | | | |
|---|---|---|---|
| 4,635,347 | 1/1987 | Lien et al. | 438/664 |
| 4,877,755 | 10/1989 | Rodder | 438/664 |
| 5,352,631 | 10/1994 | Sitaram et al. | 438/303 |
| 5,550,084 | 8/1996 | Anjum et al. | 438/683 |

*Primary Examiner*—Chandra Chaudhari
*Attorney, Agent, or Firm*—Frishauf, Holtz, Goodman, Langer & Chick, P.C.

[57] ABSTRACT

A field oxide is selectively formed on a silicon substrate. A first gate oxide is formed on the silicon substrate. Formed on the first gate oxide film is a floating gate which is comprised of a stack of a polysilicon film and a silicide layer with different thicknesses at different locations. Oxide spacer are formed on the side portions of the floating gate. A source region and a drain region are formed on the silicon substrate with a channel region disposed therebetween. Silicide layers are respectively formed on the source region and the drain region. The depth of the drain side silicide layer is shallower than the depth of the source side silicide layer. A step is provided on the surface of the floating gate. A control gate is formed on the floating gate via a gate insulator film. This structure provides a floating gate type non-volatile semiconductor memory device having a silicide layer which is optimized in accordance with the characteristics that are respectively needed for the source region and the drain region.

37 Claims, 11 Drawing Sheets

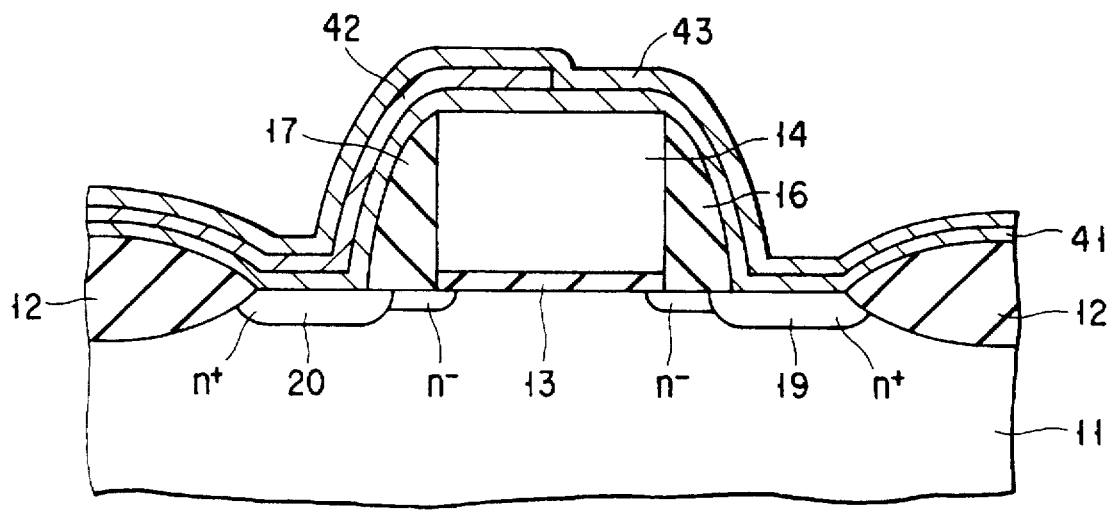
F I G. 4
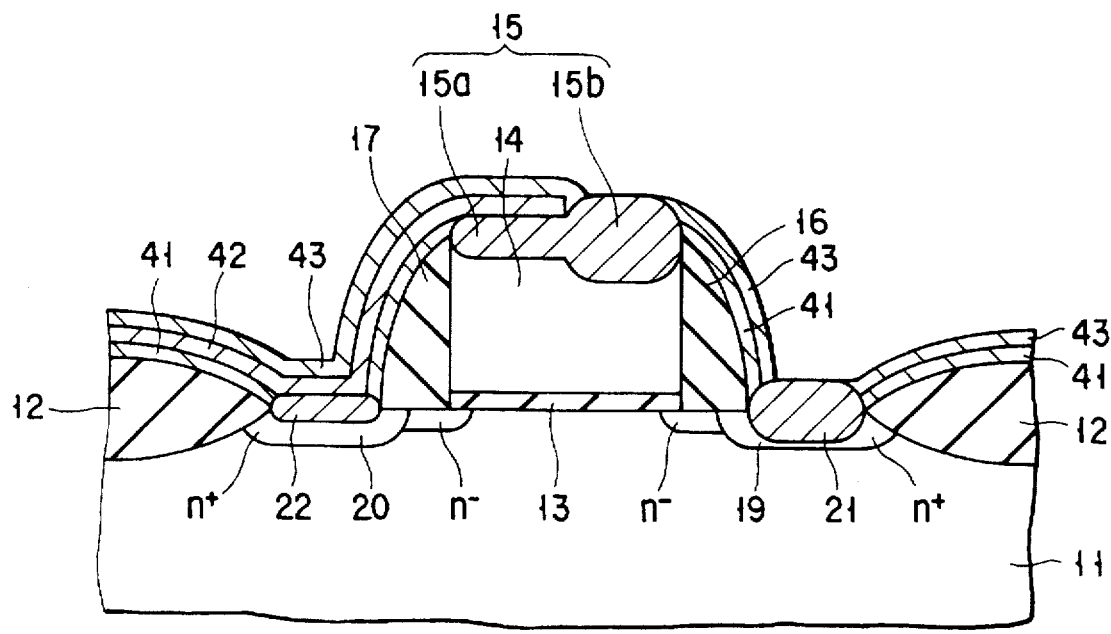
F I G. 5

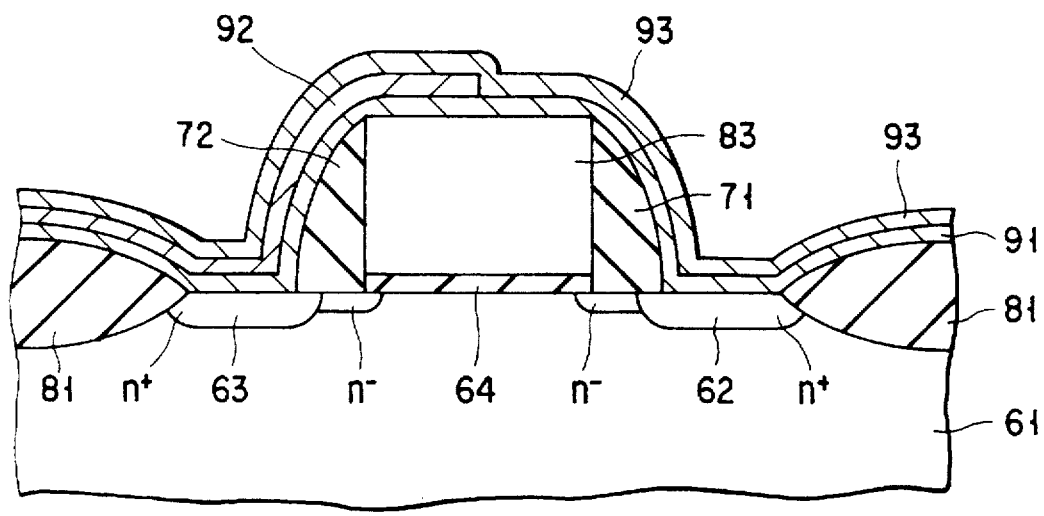
F I G. 8
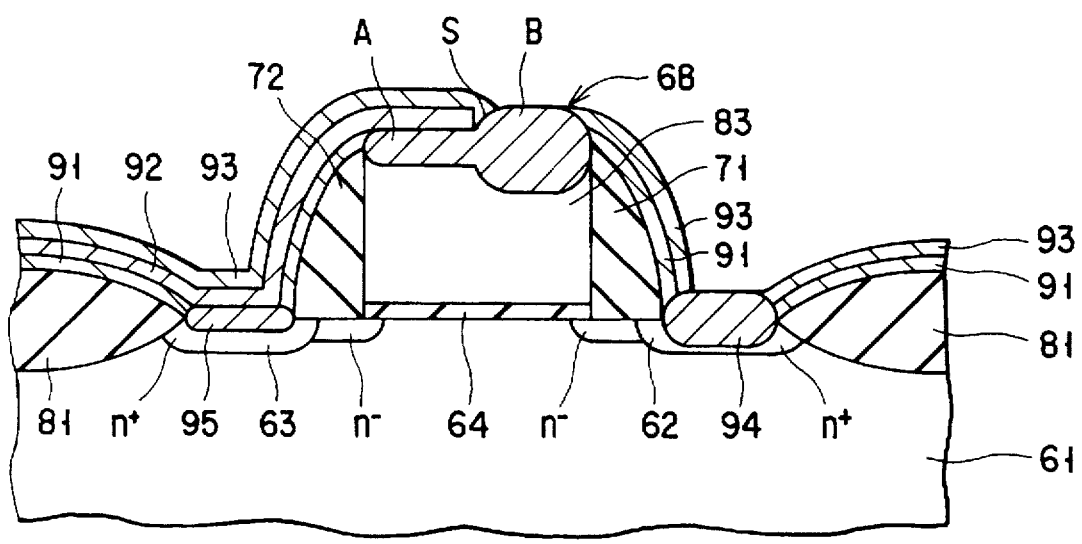
F I G. 9

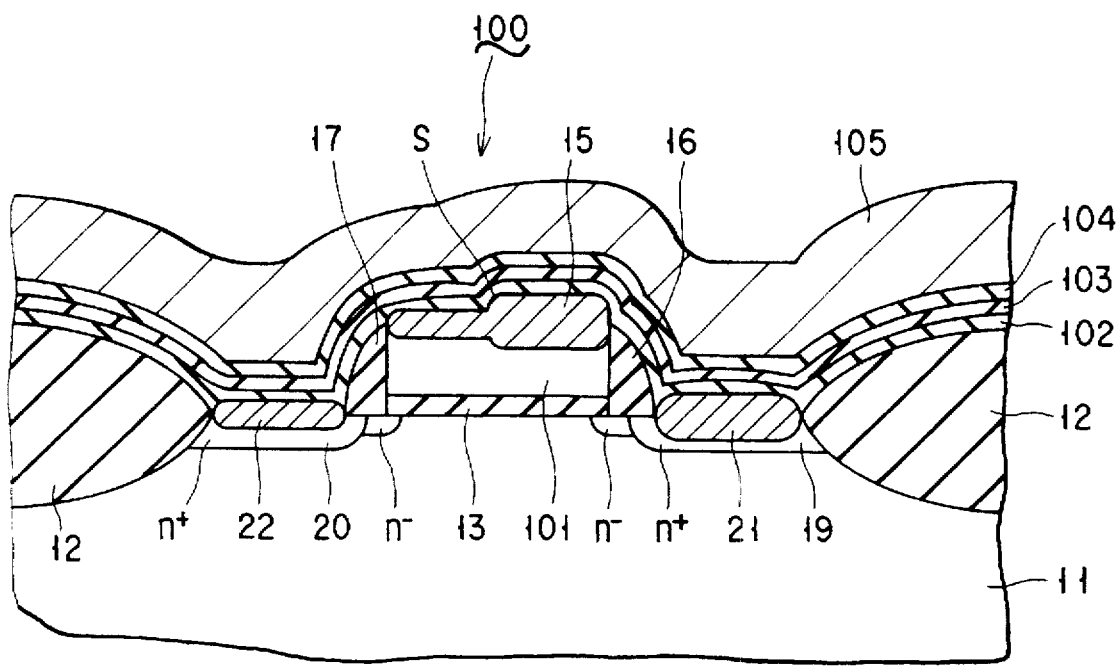
F I G. 10
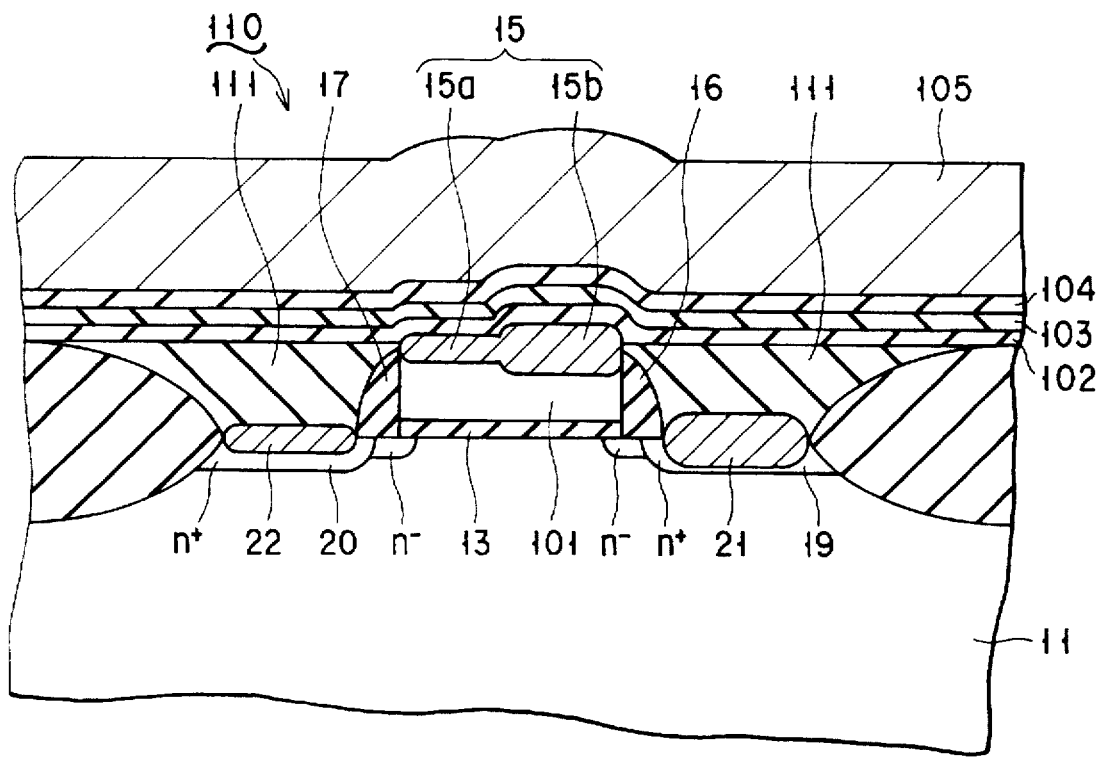
F I G. 11

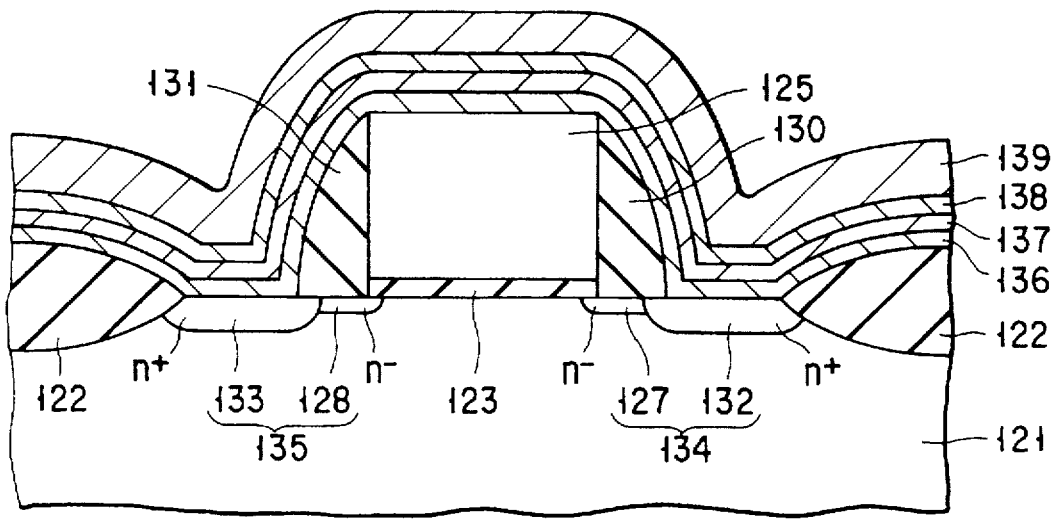
F I G. 13A
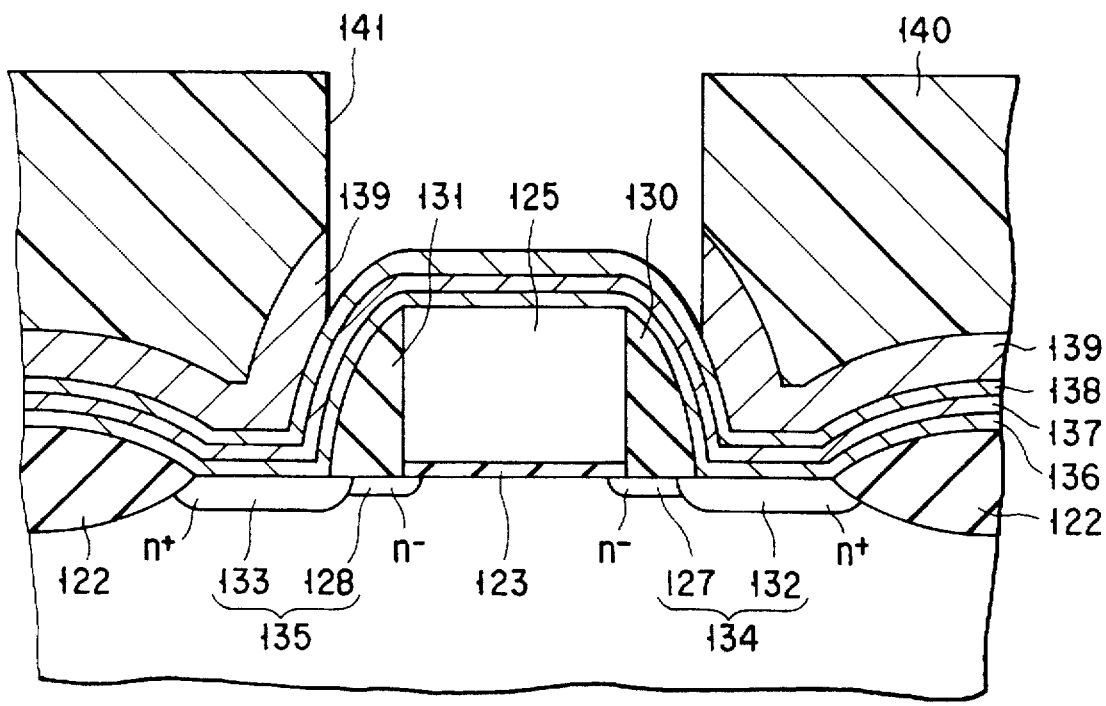
F I G. 13B

METHOD OF FORMING FLOATING GATE TYPE NON-VOLATILE SEMICONDUCTOR MEMORY DEVICE HAVING SILICIDED SOURCE AND DRAIN REGIONS

BACKGROUND OF THE INVENTION

1. Field of the Invention

The present invention relates to a method of fabricating a floating gate type non-volatile semiconductor memory device. More particularly, this invention relates to a method of fabricating a floating gate type non-volatile semiconductor memory device having a silicide layer as a low-resistance layer.

This invention also relates to a floating gate type non-volatile semiconductor memory device having a stepped gate and a method of fabricating the same.

This invention relates to a method of fabricating a semiconductor device having a silicide layer as a low-resistance layer.

2. Description of the Related Art

As the miniaturization of semiconductor devices progresses, it becomes necessary to further reduce the sheet resistance and contact resistance of an impurity diffusion layer. The silicide technology is a promising technology which meets this requirement.

The following discusses the silicide technology. First, the surface of an impurity diffusion layer formed in a semiconductor substrate is exposed and a refractory metal of Ti, Co, Ni or the like is deposited on this exposed surface. Next, the semiconductor substrate is subjected to a heat treatment. Consequently, the atoms of silicon (Si) in the impurity diffusion layer react with the atoms of the refractory metal, forming a silicide layer of, for example, $TiSi_2$. If this silicide layer is sufficiently thick, the sheet resistance and contact resistance are reduced by the factor of one order at a maximum as compared with the case where there is no silicide layer. in this respect, the silicide technology is becoming essential in the submicron MOS technology.

As the miniaturization of MOS transistors improves, the diffusion layer becomes shallower and the sheet resistance of the diffusion layer drops. As a result, the contact resistance between the diffusion layer and a metal interconnection layer increases. To prevent an increase in this contact resistance, a salicide structure having silicide layers on the polysilicon gate, the source region and the drain region has been put to a practical use. In a fabrication of the salicide structure, refractory metal is deposited on the polysilicon gate, the source region and the drain region and the resultant structure is then subjected to a heat treatment forming silicide layers.

As semiconductor devices become further miniaturized, the impurity diffusion layer also becomes shallower. If a heat treatment is carried out with refractory metal deposited too thick (e.g., 0.1 μm) on a relatively shallow (e.g., 0.2 μm) impurity diffusion layer, silicide forming reaction, termed as silicidation hereinafter, excessively occurs and the formed silicide breaks the pn junction. Under this situation, junction leakage becomes too large to use this structure as a semiconductor device.

A thin silicide layer may be formed by making the metal layer thinner in accordance with the depth of the impurity diffusion layer, or shortening the time for the heat treatment when the metal layer is thick. In this case, however, the reduction in sheet resistance becomes insufficient and thus reduces the merit of silicidation.

The demerit of making the silicide layer thinner is that the sheet resistance of the interconnection layers formed of polysilicon in the multi-layered interconnection structure and the contact resistance at the connection section between the interconnection layers are not reduced sufficiently.

In the salicide structure of the conventional MOS transistor, refractory metal is deposited with a uniform thickness on the polysilicon gate, the source region and the drain region, and the substrate is subjected to a uniform heat treatment forming a silicide layer. This silicide layer is therefore formed at the same depth on the source region and the drain region.

In an MOS transistor, the allowance for the leak current at the source/drain junction on the source side differs from that on the drain side. This will be discussed below more specifically. Normally, while a voltage is applied to the drain region of an MOS transistor, the source region is floating or grounded. In this respect, the junction leakage is severely restricted in the drain region whereas it is not in the source region.

It is therefore desirable to form the silicide layer thin on the drain region to suppress the erosion of the diffusion layer by silicide and prevent junction leakage. It is preferable that the silicide layer be formed thicker on the source region than on the drain region to reduce the contact resistance between the diffusion layer and the overlying interconnection layer.

In an MOS transistor with the conventional salicide structure, the silicide layer is formed at the same depth on the source region and the drain region. That is, the formed silicide layer is not optimized in accordance with the characteristics that are respectively needed for the source region and the drain region. Further, the method of fabricating an MOS transistor with the conventional salicide structure cannot form a silicide layer which is optimized in accordance with the characteristics that are respectively needed for the source region and the drain region.

As the capacity increases, faster data writing and faster erasure are demanded of non-volatile semiconductor memory devices such as an EEPROM and a flash memory.

The gate coupling ratio is one factor to determine the writing and erasing speeds of memory cell transistors in a non-volatile semiconductor memory device. The greater the gate coupling ratio is, the faster the writing and erasure become with the same applied voltage.

This gate coupling ratio increases as the capacitance between the floating gate and the control gate and becomes greater than the capacitance between the channel region and the floating gate. To increase the gate coupling ratio, therefore, the overlapping area of the floating gate and the control gate is designed larger than the overlapping area of the channel region and the floating gate so that the capacitance between the floating gate and the control gate becomes greater than the capacitance between the channel region and the floating gate.

Setting the overlapping area of the floating gate and the control gate larger than the overlapping area of the channel region and the floating gate, however, increases the occupying area of the memory cell transistors. This decreases the integration density of a non-volatile semiconductor memory device.

SUMMARY OF THE INVENTION

Accordingly, it is the primary object of the present invention to provide a semiconductor device having a silicide layer formed on the source region and the chain region which is optimized in accordance with the characteristics that are respectively needed for the source region and the drain region.

It is the secondary object of this invention to provide a method of fabricating a semiconductor device that can form a silicide layer formed on the source region and the chain region which is optimized in accordance with the characteristics that are respectively needed for the source region and the drain region.

It is the third object of this invention to provide a stepped floating gate type non-volatile semiconductor memory device which has improved writing and erasing speeds without increasing the occupying area per memory cell, and a method of fabricating the same.

It is the fourth object of this invention to provide a method of forming silicide in a semiconductor device which can easily control the film thickness of silicide and reduce the sheet resistance of a conductive layer formed of silicon and the contact resistance between the conductive layer and another conductive layer, and a method of fabricating a semiconductor device, which employs the former silicide forming method.

It is the fifth object of this invention to provide a method of fabricating a semiconductor device, which can easily optimize the thickness of a silicide layer.

According to the first aspect of this invention, a method of fabricating a floating gate type non-volatile semiconductor memory device, comprising steps of:

providing a first metal layer of a silicide forming metal, which is capable of forming silicide by reaction with silicon, over a surface of a silicon substrate having at least a source region, a drain region, a channel region disposed between the source and drain regions and a floating gate of silicon provided above the channel region;

providing a reaction suppressing layer on the first metal layer at least over the drain region and excluding over the source region, for suppressing a silicidation;

providing a second metal layer of the silicide forming metal on the first metal layer and the reaction suppressing layer;

subjecting the silicon substrate to a heat treatment to form silicide layers respectively on the source region and the drain region by silicidations between the source region and the first and second metal layers and between the drain region and the first metal layer; and providing a control gate over the floating gate, an insulator film disposed between the floating and control gates.

According to the second aspect of this invention, a floating gate non-volatile semiconductor memory device comprising:

a semiconductor substrate of one conductivity type;

a source region and a drain region of opposite conductivity types provided apart from each other on a major surface of the semiconductor substrate;

a floating gate provided above a channel region between the source region and the drain region, a first gate insulator film being disposed between the floating gate and the channel region; and a control gate provided over the floating gate, a second gate insulator film being disposed between the control and floating gates, wherein the surface of the floating gate has at least one step.

According to the third aspect of this invention, a method of fabricating a floating gate type non-volatile semiconductor memory device, comprising steps of:

forming a first metal layer of a silicide forming metal, which is capable of forming silicide by reaction with silicon, over a surface of a silicon layer as a floating gate provided above a channel region disposed between a source region and a drain region on a semiconductor substrate;

forming a reaction suppressing layer on a surface of the first metal layer which lies above a part of a surface of the silicon layer, for suppressing a silicidation;

forming a second metal layer of the silicide forming metal on the first metal layer and the reaction suppressing layer;

subjecting the semiconductor substrate to a heat treatment to form a silicide layer having two regions of different thicknesses on the surface of the silicon layer by silicidations between the silicon layer and the first metal layer and between the silicon layer and the first and second metal layers;

removing an non-reacted portion, if any, of the second metal layer; and providing a control gate over the silicide layer, a gate insulator film being disposed between the control gate and the silicide layer.

According to the fourth aspect of this invention, a method of forming a silicide layer in a semiconductor device, comprising steps of:

forming a first metal layer of a silicide forming metal capable of forming silicide by reaction with silicon, on a conductive layer of silicon;

forming a reaction suppressing layer on the first metal layer for suppressing a silicidation;

forming a second metal layer of the silicide forming metal on the reaction suppressing layer;

forming a silicon layer on the second metal layer; and performing a heat treatment to form a silicide layer by silicidations between the conductive layer and the first metal layer and between the second metal layer and the silicon layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4 and 5 are cross-sectional views showing steps in the method of fabricating the semiconductor device according to the first embodiment;

FIGS. 8 and 9 are cross-sectional views showing steps in the method of fabricating the semiconductor device according to the second embodiment;

FIG. 10 is a cross-sectional view of a non-volatile semiconductor memory device according to the third embodiment;

FIG. 11 is a cross-sectional view showing a modification of the non-volatile semiconductor memory device according to the third embodiment;

FIGS. 13A and 13B are cross-sectional views showing steps in the method of fabricating the semiconductor device according to the fourth embodiment;

DETAILED DESCRIPTION OF THE PREFERRED EMBODIMENTS

The first embodiment of the present invention will now be described specifically.

Figure 1:
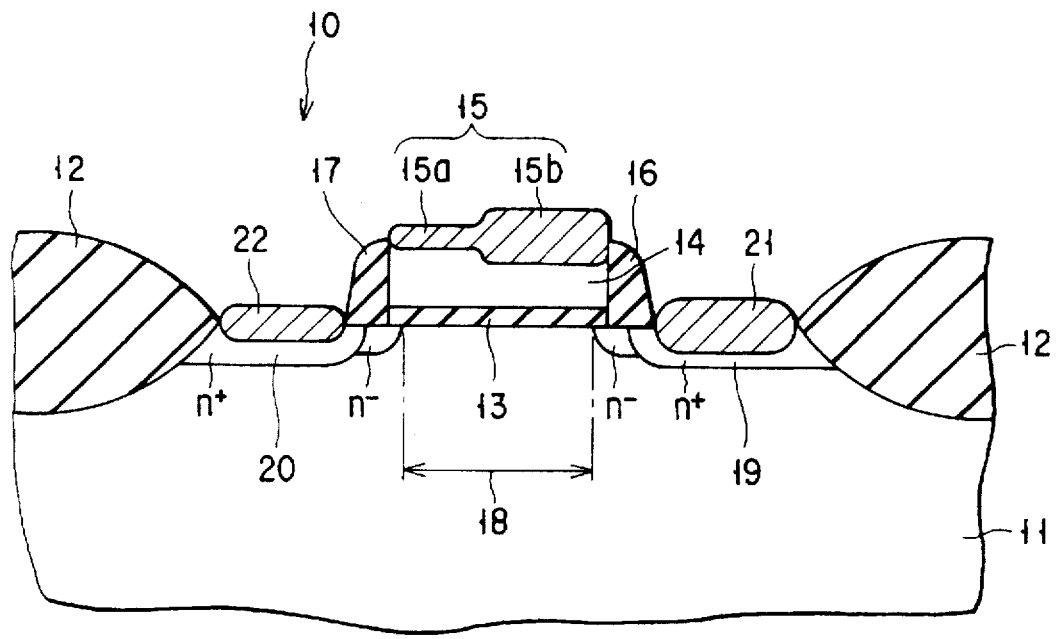
FIG. 1 is a cross-sectional view of a semiconductor device according to the first embodiment.

FIG. 1 is a cross-sectional view showing a semiconductor device according to the first embodiment of this invention. In FIG. 1, a field oxide 12 is selectively formed on a silicon substrate 11. A gate oxide 13 is formed on the silicon substrate 11. Formed on the gate oxide 13 is a gate electrode 14 which is comprised of a polysilicon film. A silicide layer 15 is formed on the surface of the gate electrode 14. A drain side portion 15a of the silicide layer 15 is formed thinner than a source side portion 15b. Oxide spacers 16 and 17 are formed on the side portions of the gate electrode 15.

A source region 19 and a drain region 20 are formed in the silicon substrate 11 with a channel region 18 defined therebetween. Each of the source region 19 and the drain region 20 is comprised of a low concentrate impurity diffusion region $n^-$ and a high concentrate impurity diffusion region $n^+$ formed adjacent to the region $n^-$. Those regions $n^-$ and $n^+$ constitute an LDD (Lightly Doped Drain) structure.

Figure 2:
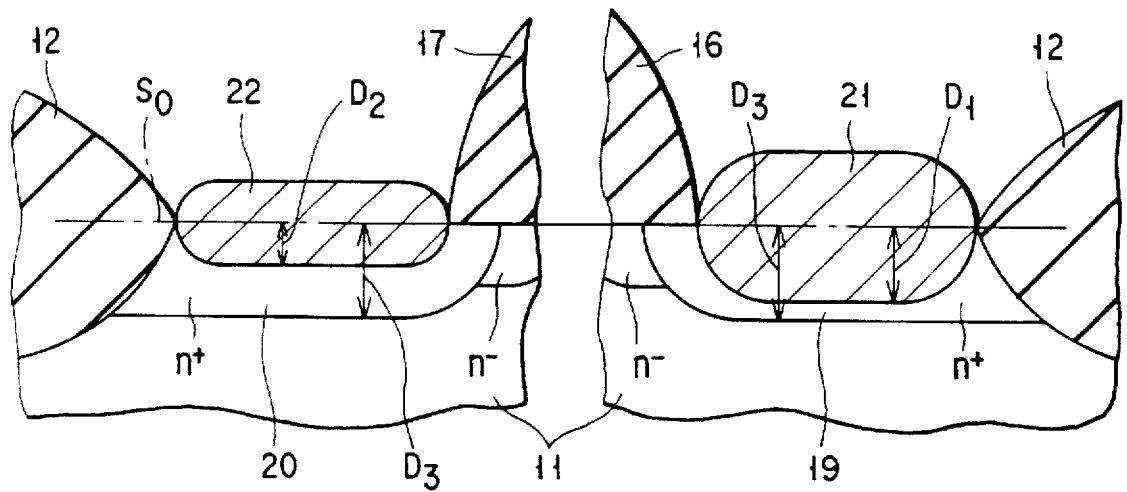
FIG. 2 is a cross-sectional view showing the essential portions of the semiconductor device according to the first embodiment.

Silicide layers 21 and 22 are respectively formed on the source region 19 and the drain region 20. As shown in FIG. 2, the depth $D_1$ of the source side silicide layer 21 from the major surface $S_0$ of the silicon substrate 11 to the source region 19 differs from the depth $D_2$ of the drain side silicide layer 22 from the surface $S_0$ of the silicon substrate 11 to the drain region 20. Specifically, the depth $D_2$ of the drain side silicide layer 22 is shallower than the depth $D_1$ of the source side silicide layer 21.

In an MOS transistor 10 described above, providing the difference between the depth $D_1$ of the source side silicide layer 21 and the depth $D_2$ of the drain side silicide layer 22 is excellent in that it can meet different characteristics of the silicide layer which are needed on the source region 19 and the drain region 20. Specifically, the MOS transistor 10 has different allowances for the leak current at the source and drain junctions. Normally, a voltage is applied to the drain region 20 of the MOS transistor, while the source region 19 is floating or grounded. Accordingly, the junction leakage should be severely prohibited in the drain region 20, whereas not in the source region 19. It is therefore desirable to form the drain side silicide layer 22 shallower to suppress the erosion of the diffusion layer by silicide, thereby preventing junction leakage. Even if the source side silicide layer 21 is formed deeper so that junction leakage is apt to occur, the source region 19 is given a greater tolerance for the junction leakage so that no significant problem arises. It is therefore preferable that the depth $D_1$ of the source side silicide layer 21 be designed greater than the thickness of the drain region 22 to reduce the contact resistance between the source region 19 and an overlying interconnection layer (not shown) and the sheet resistance of the source region 19.

To achieve a higher integration density of MOS transistors 10, it is also preferable that the depth $D_3$ of the high concentrate impurity diffusion regions $n^+$ of the source region 19 and the drain region 20 be sufficiently shallow and the depths $D_1$ and $D_2$ of the source side silicide layer 21 and the drain side silicide layer 22 be properly set. Specifically, the depths $D_1$ and $D_2$ of the silicide layers 21 and 22 have the following relationship with the depth $D_3$ of the high concentrate impurity diffusion region $n^+$.

$D_1:D_3=0.1:1$ (preferably 0.2:1) to 0.8:1
$D_2:D_3=0:1$ to 0.6:1

When the depths $D_1$ to $D_3$ meet the above relationships, even if the high concentrate impurity diffusion region $n^+$ becomes shallow so that the sheet resistance increases, the resistances of the source region 19 and the drain region 20 are reduced by the silicide layers 21 and 22 respectively provided on the source region 19 and the drain region 20. The generation of the junction leakage is suppressed because of the shallow depth $D_2$ of the drain side silicide layer 2 and therefore severe requirement against the junction leakage in the drain region 20 comes to be met. Since there is no stringent requirement against the junction leakage in the source region 19, lower resistance can be achieved by setting the depth $D_1$ of the source side silicide layer 22 deeper, i.e., forming the source side silicide layer 22 thicker.

The source side silicide layer 21 and the drain side silicide layer 22 may be made of the same silicide or different suicides. Silicides in this example include tungsten silicide, titanium silicide, cobalt silicide and nickel silicide.

The silicide layer 15 formed on the surface of the gate electrode 14 may be comprised of the same kind of silicide as those of the source side silicide layer 21 and the drain side silicide layer 22. Further, the silicide layer 15, the source side silicide layer 21 and the drain side silicide layer 22 may have salicide structures formed by the same step.

In the first embodiment, although the gate electrode 14 is formed of single polysilicon, at least the uppermost layer of the gate electrode 14 may be formed of silicon. The silicide layer should not necessarily be formed on the gate electrode 14. The silicide layer 15 may have a uniform thickness.

The MOS transistor 10 according to the first embodiment may be fabricated as follows.

Figure 3A:
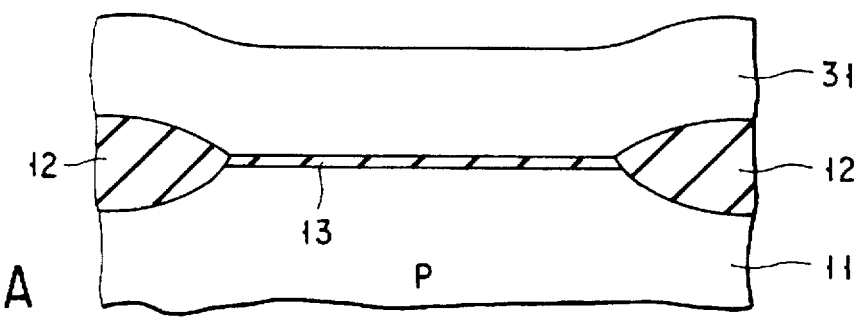
FIGS. 3A to 3E are cross-sectional views illustrating steps in a method of fabricating the semiconductor device according to the first embodiment.

As shown in FIG. 3A, the field oxide 12 is formed on the silicon substrate 11 by the local oxidation of silicon (LOCOS) method. The gate oxide 13 with a thickness of, for example, 15 nm is formed on the active region, which is defined by the field oxide 12, by thermal oxidation.

Next, a polysilicon film 31 with a thickness of, for example, 300 nm is formed on the gate oxide 13. Phosphorus (P) is doped as an impurity in the polysilicon film 31 by the gas phase diffusion method in order to improve a conductivity the polysilicon film 31.

Then, a resist pattern (not shown) is formed on the polysilicon film 31, and reactive ion etching (RIE) is performed on the resultant structure using hydrogen bromide gas and chlorine gas as etching gases to remove the polysilicon film 31 and the gate oxide 13 which are exposed in the openings of the resist pattern. Thereafter, the resist pattern is removed. Consequently, the gate electrode 14 is formed above the channel region 18 on the silicon substrate 11, as shown in FIG. 3B.

Figure 3B:
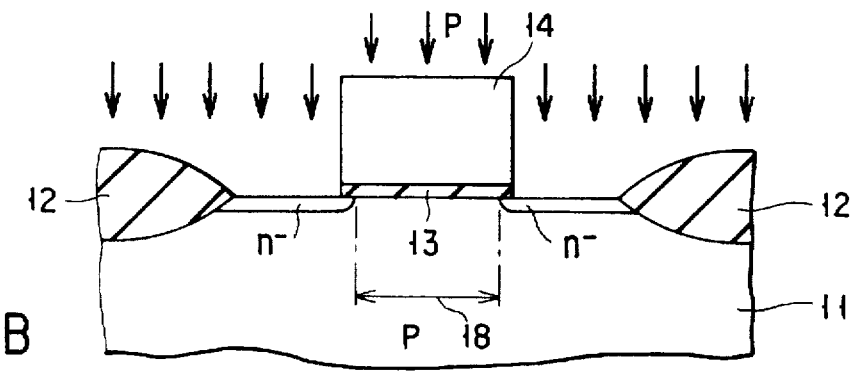

Then, P ions with a low concentration are injected into the silicon substrate 11 having the gate electrode 14 formed thereon, thus forming the low concentrate impurity diffusion region n⁻, as shown in FIG. 3B.

Figure 3C:
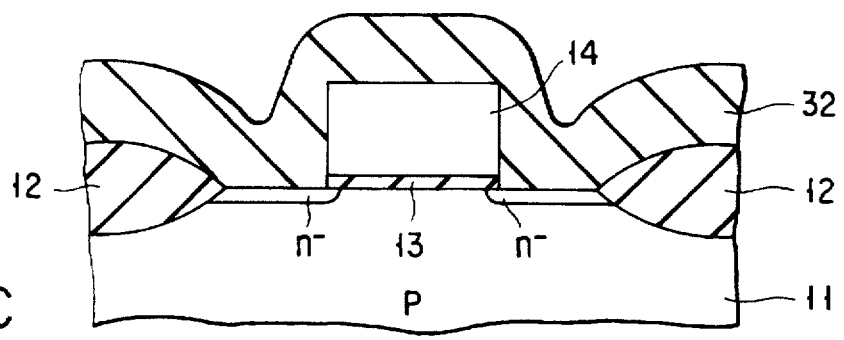
Figure 3D:
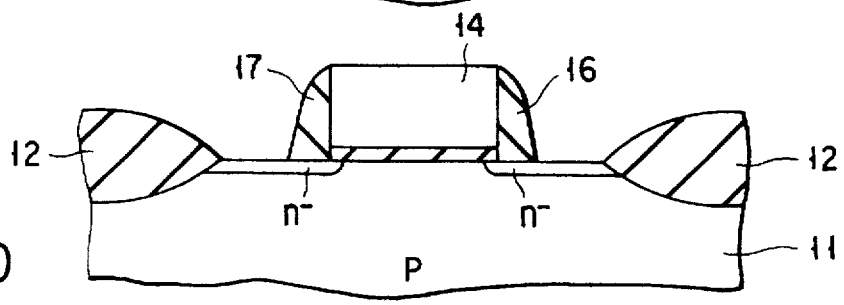

Next, a silicon oxide 32 is formed on the silicon substrate 11 by the CVD (Chemical Vapor Deposition) method and the silicon oxide 32 is etched by anisotropic RIE as shown in FIG. 3C. As a result, the oxide spacers 16 and 17 are formed on the side portions of the gate electrode 14, as shown in FIG. 3D.

Figure 3E:
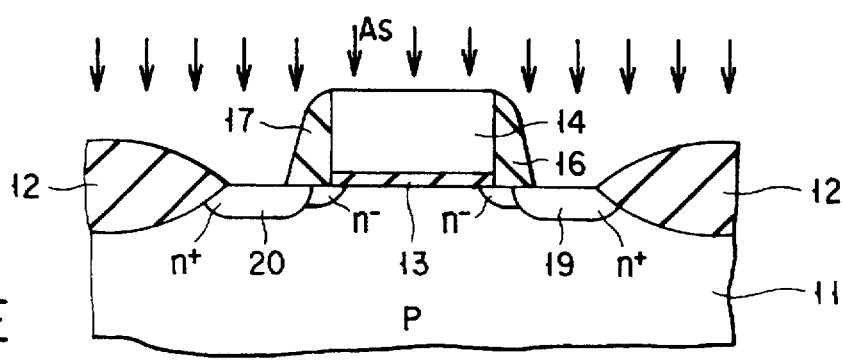

Then, as shown in FIG. 3E, As ions are injected at a high concentration into the exposed silicon substrate 11 to form the high concentrate impurity diffusion region n⁺, thereby forming the source region 19 and the drain region 20 with the so-called LDD structure.

As shown in FIG. 4, a first metal layer 41 is formed on the entire surface of the silicon substrate 11 including the source region 19, the drain region 20 and the gate electrode 14. The metal of which the first metal layer 41 is formed is a metal which can form silicide when reacted with silicon (this metal will be hereinafter called "silicide forming metal"). This silicide forming metal is, for example, refractory metal, more specifically, at least one kind of metal selected from a group of tungsten (W), cobalt (Co), titanium (Ti) and nickel (Ni). The first metal layer 41 can be formed by a known thin film forming technology, such as sputtering or CVD.

Actually, the first metal layer 41 is formed of a titanium layer with a thickness of 50 nm or less, specifically, 10 nm, by CVD using sputtering.

Then, a reaction suppressing layer 42 is formed on the first metal layer 41 including at least above the drain region 20 and excluding above the source region 19. Specifically, the reaction suppressing layer 42 is formed on the drain side field oxide 12, the drain region 20, the drain side space oxide 17 and about half the surface area of the gate electrode 14.

The reaction suppressing layer 42 is formed of a material which causes no silicidation with silicon, or low-resistance material which may cause a silicidation but has a lower reactivity than the mentioned metal. One example of the material for the reaction suppressing layer 42 is a metal nitride. This metal nitride may be a nitride of the aforementioned silicide forming metal. More specifically, the metal nitride is at least one kind selected from a group of titanium nitride, cobalt nitride, nickel nitride and tungsten nitride. When the reaction suppressing layer 42 is formed of a metal nitride, this metal nitride should not necessarily be a nitride of the same metal as is used for the first metal layer 41. When a metal nitride is the material for the reaction suppressing layer 42, this layer 42 may be formed by CVD, sputtering and the other applicable to this process.

As the reaction suppressing layer 42, a titanium nitride layer with a thickness of 20 nm or less, preferably ranging from 0.5 nm to 20 nm, is formed on the first metal layer 41 by reactive sputtering at the ratio of Ar 0.5 to 3% by weight of N₂ to 97 to 99.5% by weight of Ti.

A second metal layer 43 is formed on the entire surface of the first metal layer 41 including the reaction suppressing layer 42. The second metal layer 43, like the first metal layer 41, is formed of a silicide forming metal. The first metal layer 41 and the second metal layer 43 should not necessarily be formed of the same kind of metal.

Thereafter, the silicon substrate 11, containing the field oxide 12, the gate oxide 13, the gate electrode 14, the oxide spacers 16 and 17, the first metal layer 41, the reaction suppressing layer 42 and the second metal layer 43, is subjected to a heat treatment. More specifically, RTN (Rapid Thermal Nitrization) is performed under the nitrogen or ammonia environment. This heat treatment causes a silicidation between the source region 19 and the first and second metal layers 41 and 43, forming the thick source side silicide layer 21, as shown in FIG. 5.

The first metal layer 41, the reaction suppressing layer 42 and the second metal layer 43 are sequentially deposited on the drain region 20. When this lamination structure is subjected to a heat treatment, a silicidation occurs between the silicon constituting the drain region 20 and the first metal layer 41. However, the reaction suppressing layer 42 provided on the first metal layer 41 is formed of a material which causes no silicidation with silicon, or a material which may cause a silicidation but has a lower reactivity than the metals which constitute the first metal layer 41 and the second metal layer 43. Although the first metal layer 41 reacts with silicon so silicidation progresses, therefore, the silicidation stops at the reaction suppressing layer 42 or gets considerably slow after the first metal layer 41 is entirely silicided and used up. When the first metal layer 41 is entirely silicided, the drain side silicide layer 22 does not become thicker. Consequently, the shallow silicide layer 22 is formed on the drain region 20. What is more, the thickness of the silicide layer 22 depends on the thickness of the first metal layer 41 but not the temperature nor time of the heat treatment when the silicidation is sufficiently performed.

The reaction suppressing layer 42 is formed on approximately half the surface of the gate electrode 14 on the drain side. In the area of the gate electrode 14 where the reaction suppressing layer 42 is formed, a silicidation occurs only between the silicon which constitutes the gate electrode 14 and the first metal layer 41, thus yielding the thin drain side portion 15a. The reaction suppressing layer 42 is not formed in the remaining, source side region of the gate electrode 14, so that a silicidation occurs between silicon and the first and second metal layers 41 and 42 in this source side region. As a result, the thick source side portion 15b is formed on the gate electrode 14.

A silicide layer of a uniform thickness may be formed by performing a heat treatment with forming the reaction suppressing layer 42 on the entire surface of the gate electrode 14 or without forming the reaction suppressing layer on the gate electrode 14.

Next, etching is performed with NH₄OH to remove the non-reacted first metal layer 41, reaction suppressing layer 42 and second metal layer 43. Thereafter, an interlayer insulator film, an upper interconnection layer, etc. are formed by the ordinary process to finally obtain the MOS transistor 10.

In the above-described method of fabricating the MOS transistor 10, the thicknesses of the source side silicide layer 21 and the drain side silicide layer 22 can be controlled by changing the thicknesses of the first metal layer 41 and/or the second metal layer 43.

Given that the junction depth of the source region 19 is $X_{Sj}$, the junction depth of the drain region 20 is $X_{Dj}$, the thickness of the first metal layer 41 is $t_1$, and the thickness of the second metal layer 42 is $t_2$ and that the first metal layer 41 and the second metal layer 43 are made of titanium, it is preferable that those four parameters satisfy the following relationships.

$t_1 < X_{Dj}/2.25$

[∵ the thickness of silicon to be consumed with respect to the thickness $t_1$ of the first metal layer is 2.24 and the thickness of silicide (TiSi) to be formed becomes 2.50.]

$t_1 + t_2 < X_S/2.25$ $t_1 = 0$ or $0 < t_1 < 100$ (nm)

[∵ the junction depth is assumed to be 0.23 μm or less.]

$t_1 < t_1 + t_2$

It is more desirable that $t_1 \leq 0.7 \times X_{Dj}/2.25$ (nm), i.e., $0 \leq t_1 \leq 70$ (nm) be fulfilled.

As apparent from the above, the depth $D_2$ of the drain side silicide layer 22 to be formed on the drain region 20 can be optimized by properly setting the thickness of the first metal layer 41. Setting the depth $D_2$ of the drain side silicide layer 22 sufficiently shallower can prevent junction leakage from occurring by the overerosion of the drain region 20 by silicide.

A known method of controlling the thickness of a silicide layer is to inject electrically inactive ions, such as silicon ions, oxygen ions or nitrogen ions, only into the source region to damage the crystallization on the silicon layer surface to help smoothly carry out a silicidation, thereby selectively making the silicide to be formed on the source region thicker. This method however usually suffers plasma damage or heavy metal contamination, which is likely to occur by ion injection. In this respect, it is typical to form a silicon oxide or the like on the source region as a protection layer prior to ion injection. In this case, the protection layer should be removed after ion injection.

In this method, the source region is damaged by ion injection. Before the silicide layer is formed, therefore, dilute HF cleaning is generally performed to expose the surface of the silicon substrate. At this time, if the silicon layer were damaged by ion injection, it would become chemically unstable so that a layer which would not normally be etched would be etched. It is therefore necessary to execute a heat treatment for recovering the damage after the ion injection.

According to the semiconductor device fabricating method according to the first embodiment, the silicide layers 21 and 22 with different thicknesses can be formed on the source region 19 and the drain region 20 respectively without performing ion injection, thus preventing the ion-injection oriented problem of the conventional method of controlling the thickness of a silicide layer.

Figure 6:
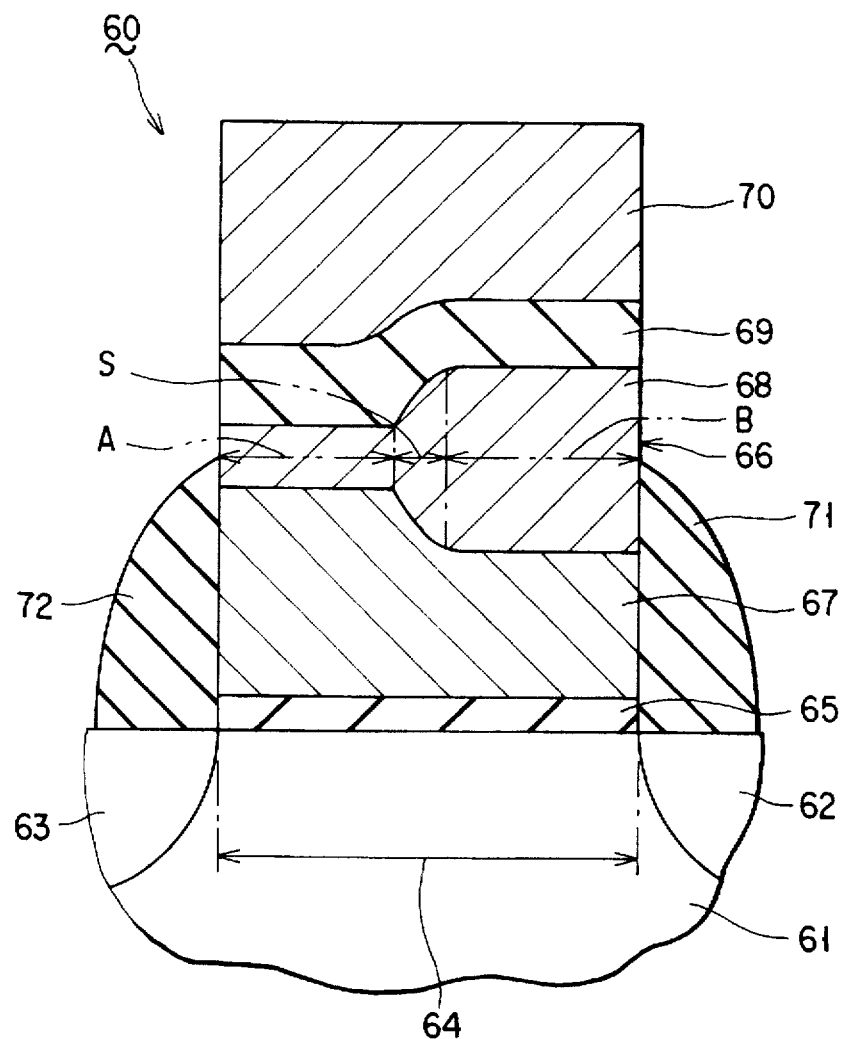
FIG. 6 is a cross-sectional view of a semiconductor device according to the second embodiment.

A description will be given of a stepped floating gate type non-volatile semiconductor memory device according to the second embodiment of the invention. As shown in FIG. 6, for example, a floating gate 66 is formed via a first gate insulator film 65 on a channel region 64 which is disposed between a source region 62 and a drain region 63 both formed in a silicon substrate 61. The floating gate 66 is comprised of a silicon layer 67 and a silicide layer 68 stacked in the named order. The silicon layer 67 is made of polysilicon or amorphous silicon. The silicide layer 68 has two regions A and B with different thicknesses with a step S formed therebetween. Thus, the floating gate 66 has the step S on its surface.

A second gate insulator film 69 is formed on the surface of this silicide layer 68, and a control gate 90 of, for example, polysilicon or amorphous silicon is formed on the surface of the second gate insulator film 69.

Oxide spacers 71 and 72 are formed on the side portions of the floating gate 67.

According to a memory cell transistor 60 in the non-volatile semiconductor memory device which has the above-discussed structure, the silicide layer 68 has the two regions A and B with different thicknesses with the step S formed therebetween. Therefore, the surface area of the floating gate 66 increases by the step S as compared with a memory cell transistor in a floating gate type non-volatile semiconductor memory device which has an ordinary floating gate that has no step on its surface. However, the occupying areas of both floating gates, i.e., the areas of the cross sections of both floating gates which are cut parallel to the major surface of silicon substrate 61 are equal to each other. While the occupying area of the floating gate 66 of the memory cell transistor 60 embodying this invention is the same as that of the ordinary floating gate, the area of the floating gate 66 which overlaps the control gate 90 (hereinafter called "overlapping area") becomes greater than that of the ordinary floating gate. In the floating gate type non-volatile semiconductor memory device, as the overlapping area of the floating gate and the control gate increases, the capacitance between the floating gate and the control gate becomes greater. Accordingly, the gate coupling ratio of the memory cell transistor increases. The memory cell transistor 60 according to the second embodiment therefore has a greater gate coupling ratio than that of the ordinary type though the occupying area is the same.

As described above, the non-volatile semiconductor memory device 60 according to the second embodiment can increase the gate coupling ratio to achieve faster writing and erasure without increasing the occupying area of the floating gate and thus without increasing the occupying area of the memory cell transistor.

The floating gate type non-volatile semiconductor memory device 60 according to the second embodiment may be fabricated as follows.

Figure 7A:
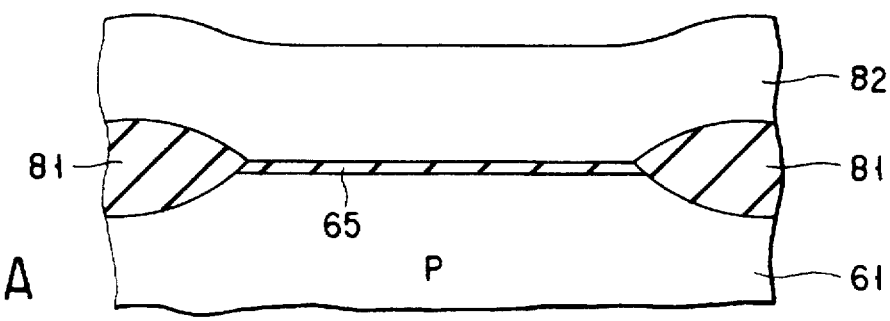
FIGS. 7A to 7E are cross-sectional views illustrating steps in a method of fabricating the semiconductor device according to the second embodiment.

As shown in FIG. 7A, a field oxide 81 is formed on the silicon substrate 61, and the first gate oxide 65 is formed on the active region, which is defined by this field oxide 81, as per the first embodiment.

Next, a polysilicon film 82 is deposited on the first gate oxide 65, as per the first embodiment. Phosphorus (P) is doped as an impurity in the polysilicon film 82 by the gas phase diffusion method in order to improve the conductivity.

Figure 7B:
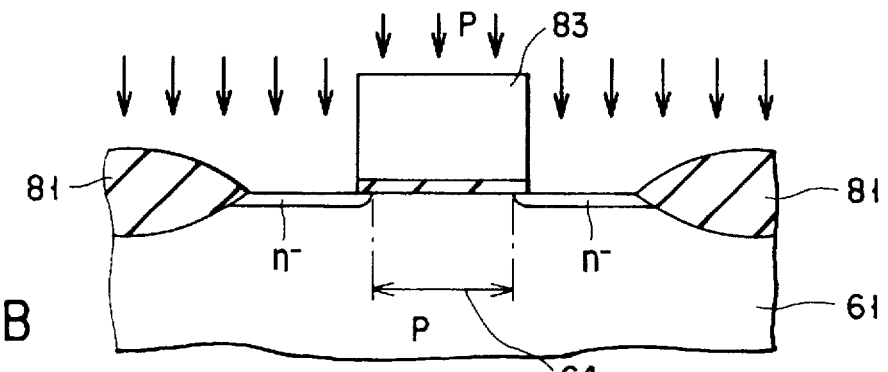

Then, a resist pattern (not shown) is formed on the polysilicon film 82, and the polysilicon film 82 is patterned with RIE, as per the first embodiment. Consequently, a patterned polysilicon film 83 is formed above the channel region 64 in the silicon substrate 61, as shown in FIG. 7B. Then, P ions with a low concentration are injected into the silicon substrate 61 to form the low concentrate impurity diffusion region $n^-$.

Figure 7C:
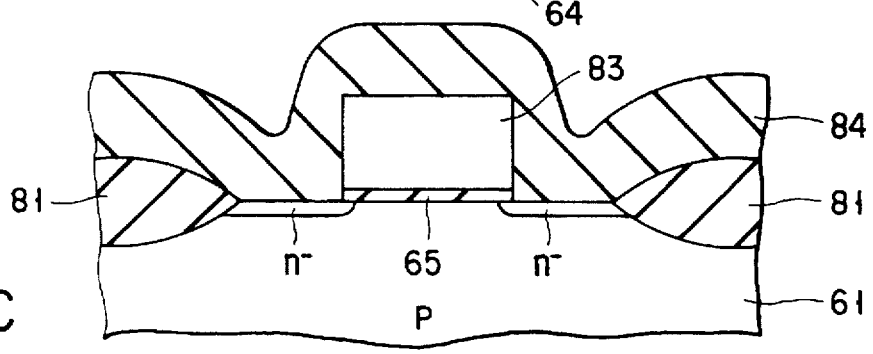
Figure 7D:
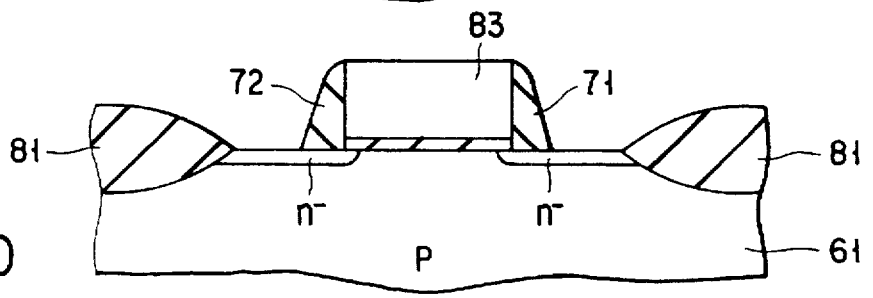

Next, a silicon oxide 84 is formed above the entire surface of the silicon substrate 61 by the CVD method and the silicon oxide 84 is etched by anisotropic RIE as shown in FIG. 7C. As a result, the oxide spacers 71 and 72 are formed on the side portions of the patterned polysilicon film 83, as shown in FIG. 7D.

Figure 7E:
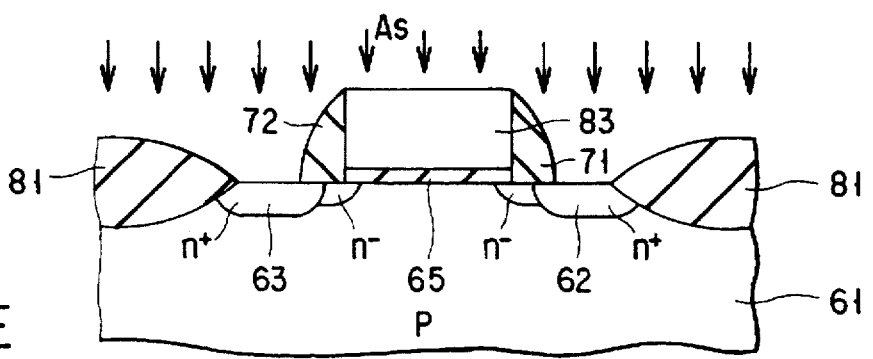

Then, as shown in FIG. 7E, As ions are injected at a high concentration into the exposed silicon substrate 61 to form the high concentrate impurity diffusion region $n_+$, thereby forming the source region 62 and the drain region 63 with the so-called LDD structure.

As shown in FIG. 8, a first metal layer 91 of a silicide forming metal is formed on the entire surface of the silicon substrate 61 and thus on the source region 62, the drain region 63 and the patterned polysilicon film 83. The silicide forming metal is the same as the one which has been discussed in the foregoing description of the first embodiment.

Then, a reaction suppressing layer 92 is formed on the first metal layer 91 covering at least a part of the patterned polysilicon film 83, specifically, covering the drain side field oxide 81, the drain region 63, the drain side space oxide 72 and about half the surface area of the polysilicon film 83. The reaction suppressing layer 92 is the same as the one which has been discussed in the foregoing description of the first embodiment.

Next, a second metal layer 93 is formed on the entire surface of the first metal layer 91 and thus on the reaction suppressing layer 92. The second metal layer 93, like the first metal layer 91, is formed of a silicide forming metal. The first metal layer 91 and the second metal layer 93 should not necessarily be formed of the same kind of metal.

Thereafter, the silicon substrate 61 is subjected to a heat treatment. More specifically, RTN is carried out under the nitrogen or ammonia environment. This heat treatment causes a silicidation between silicon and the first metal layer 91 in the drain side portion of the patterned polysilicon film 83 or the area covered by the reaction suppressing layer 92, i.e., the area above which the first metal layer 91, the reaction suppressing layer 92 and the second metal layer 93 are stacked in the named order, as shown in FIG. 8. However, the reaction suppressing layer 92 is provided on the first metal layer 91. As mentioned earlier, the reaction suppressing layer 92 is formed of a material which causes no silicidation with silicon, or low-resistance material which may cause a silicidation but has a lower reactivity than the metals of which the first metal layer 91 and the second metal layer 93 are formed. The first metal layer 91 reacts with silicon so that silicidation progresses. After the first metal layer 91 is entirely silicided and used up, therefore, the silicidation stops at the reaction suppressing layer 92 or gets considerably slow. When the first metal layer 91 is entirely silicided, the silicide layer 68 does not become thicker anymore. Consequently, the area A where the silicide layer 68 is relatively thin is formed. What is more, the thickness of the silicide layer 68 in the area A depends on the thickness of the first metal layer 91, but does not depend on the temperature nor time of the heat treatment if siliciding is sufficient when the silicidation is sufficiently performed.

In the source side portion of the patterned polysilicon film 83 or the area not covered by the reaction suppressing layer 92, i.e., the area above which the first metal layer 91 and the second metal layer 93 are stacked in order, a silicidation occurs between polysilicon and the first metal layer 91 and the second metal layer 93, thus yielding the area B where the silicide layer 68 is relatively thick.

According to the fabrication method of the second embodiment, like the fabrication method of the first embodiment, a thick source side silicide layer 94 is formed on the source region 62. A shallow silicide layer 95 is formed on the drain region 63.

After the execution of the above-discussed heat treatment, etching is performed with $NH_4OH$ to remove the non-reacted first metal layer 91, reaction suppressing layer 92 and second metal layer 93. Thereafter, the second gate oxide 69 is formed on the silicide layer 68, the silicide layer 94 and the drain side silicide layer 95, and a control gate 70 comprised of a polysilicon film is formed on the second gate oxide 69.

The second gate oxide 69 and the control gate 70 can be formed by the ordinary methods. Thereafter, an interlayer insulator film, an upper interconnection layer, etc. are formed by the ordinary process to finally obtain the memory cell transistor of the non-volatile semiconductor memory device 60 shown in FIG. 6.

The floating gate type non-volatile semiconductor memory device 60 according to the second embodiment has such an advantage that at least the formation of the step S on the surface of the floating gate can increase the gate coupling ratio. Therefore, the source side silicide layer 94 and the drain side silicide layer 95 may have the same thicknesses. To set the thickness of the source side silicide layer 94 equal to that of the drain side silicide layer 95, the reaction suppressing layer 92 is provided only on the drain side of the polysilicon film 83 and not above the drain region 63.

In the method of fabricating the floating gate non-volatile semiconductor memory device 60 according to the second embodiment, given that the silicide forming metal is titanium, the thickness of the first metal layer 91 is $t_1$ and the thickness of the second metal layer 93 is $t_2$, the thickness of the silicide layer 68 after the heat treatment (titanium silicide in this case) is $2.5t_1$ in the area A and $2.5(t_1+t_2)$ in the area B. With the surface level of the polysilicon film 83 before siliciding taken as a reference, the rise of the titanium silicide is computed to be $0.25t_1$ in the area A and $0.25(t_1+t_2)$ in the area B. Therefore, the step S has a height of $0.25(t_1+t_2) - 0.25t_1 = 0.25t_2$.

The gate coupling ratio $\alpha G_0$ of the ordinary memory cell transistor which has the same structure as the memory cell transistor in the non-volatile semiconductor memory device 60 of this embodiment except that it has no step S is expressed by the following equation (1).

$$\alpha G_0 = \frac{\dfrac{\epsilon_0 \epsilon_{0x}}{t_p} LW}{\dfrac{\epsilon_0 \epsilon_{0x}}{t_0} LW + \dfrac{\epsilon_0 \epsilon_{0x}}{t_p} LW} = \frac{\dfrac{1}{t_p}}{\dfrac{1}{t_0} + \dfrac{1}{t_p}} \quad (1)$$

where $t_0$ is the thickness of the first gate oxide, $t_p$ is the thickness (reduced to the thickness of silicon oxide) of the second gate dielectric layer, L is the channel length and W is the channel width.

The gate coupling ratio $\alpha G$ of the memory cell transistor in the non-volatile semiconductor memory device 60 of this embodiment is expressed by the following equation (2).

$$\alpha G = \frac{\dfrac{\epsilon_0 \epsilon_{0x}}{t_p}(LW + 0.25t_2 W)}{\dfrac{\epsilon_0 \epsilon_{0x}}{t_0} LW + \dfrac{\epsilon_0 \epsilon_{0x}}{t_p}(LW + 0.25t_2 W)} \quad (2)$$

$$= \frac{\dfrac{1}{t_p}\left(1 + \dfrac{0.25t_2}{L}\right)}{\dfrac{1}{t_0} + \dfrac{1}{t_p}\left(1 + \dfrac{0.25t_2}{L}\right)}$$

Thus, an increase in the gate coupling ratio $\alpha G$ of the memory cell transistor in the non-volatile semiconductor memory device 60 of this embodiment is given by the following equation (3).

$$\frac{\alpha G}{\alpha G_0} = 1 + \frac{\dfrac{0.25}{L} t_2 + t_p}{t_p + t_0 \left(1 + \dfrac{0.25t_2}{L}\right)} \quad (3)$$

More specifically, in the design rule of $L=0.5\mu m$ when the thickness of the first gate oxide to $t_0=90$ nm, the thickness of the second gate oxide $t_p=160$ nm and the thickness of the second metal layer $t_2=30$ nm with $L=0.5$ µm, an increase in the gate coupling ratio becomes 0.96%. Accordingly, $\alpha G_0$ of 50% becomes $\alpha G$ of approximately 51%.

It is apparent from the equation (3) that as the thickness of the second metal layer $t_2$ increases, an increase in the gate coupling ratio becomes greater.

FIG. 10 presents a cross-sectional view illustrating a memory cell transistor in a flash EPROM according to the third embodiment to which the first and second inventions are adapted. To avoid the redundant description, like or same reference numerals are given to those components in FIG. 10 which are the same as the corresponding components of the MOS transistor 10 shown in FIG. 1.

According to the third embodiment, a floating gate 101 of a memory cell transistor 100 is structured in the same way as the gate electrode 14 of the MOS transistor 10 of the first embodiment shown in FIG. 1. A silicon oxide 102 as the second gate oxide, a silicon nitride 103 and a silicon oxide 104 are stacked in order on the surfaces of the silicide layer 15 formed on the floating gate 101, the source side silicide layer 21 and the drain side silicide layer 22. A control gate 105 comprised of a polysilicon film is formed on the silicon oxide 104. The silicon oxide 102, the silicon nitride 103, the silicon oxide 104 and the control gate 105 can be formed by known methods.

As a modification of the memory cell transistor according to the third embodiment, as shown in FIG. 11, a silicon oxide 111 is formed on the surfaces of the silicide layer 15, the source side silicide layer 21 and the drain side silicide layer 22 by CVD. Next, the silicon oxide 111 is etched back to be flattened until the surface of the silicide layer 15 is exposed. Then, the silicon oxide 102, the silicon nitride 103 and the silicon oxide 104 are stacked in order on the surfaces of the silicide layer 15 and the silicon oxide 104, forming a second gate insulator film. The control gate 105 is formed on the surface of the silicon oxide 104. In this case, it is advantageous that the presence of the thick insulator film on the source region 19 and the drain region 20 can suppress leakage between the control gate 105 and the source region 19 or the drain region 20.

A flash EPROM equipped with the memory cell transistors 60 or 70 shown in FIG. 10 or FIG. 11 is excellent in the following points. For a single power flash EPROM, the F-N program and the F-N erasure are the essential technologies. Given that the state where the threshold value of the memory cell transistor is high is the erased state, a positive voltage is applied to the drain in programming mode so that the source region becomes floating or grounded. In erasure mode, a negative voltage is applied to the source region and the silicon substrate. As apparent from the above, either the junction between the source region and the silicon substrate is at the same potential or the floating potential is applied to the source region. It is therefore unnecessary to worry about an increase in the junction leakage which is caused by the voltage application between the source region and the silicon substrate. Even with the thick silicide layer formed on the source region, there is no need to seriously concern junction leakage. By setting deeper the depth $D_1$ of the source side silicide layer 21 which is to be formed on the source region 19 with respect to the source region 19 as shown in FIGS. 10 and 11, therefore, the sheet resistance and the contact resistance of the source region 19 can be reduced.

With regard to the drain region 20, it is necessary to concern an increase in junction leakage due to the voltage application. The junction leakage between the drain region 20 and the silicon substrate 11 can however be prevented by making shallower the depth $D_2$ of the drain side silicide layer 22 which is to be formed on the drain region 20 with respect to the drain region 20 in the memory cell transistor 100 or 110 according to the third embodiment as shown in FIG. 10 or FIG. 11.

Further, the source line in a flash EPROM is shared by multiple cells for the purpose of collective erasure, so that the total length of the source line becomes long. In the memory cell transistors 100 and 110 according to the third embodiment, the depth $D_1$ of the source side silicide layer 21 to the source region 19 is set deep to reduce the sheet resistance and the contact resistance of the source region 19, so that a variation in the threshold values from one cell to another becomes small. Accordingly, the number of cells to be connected to a single source line can be increased, so that the area of the memory cell array becomes smaller.

Formed on the gate electrode 14 is the silicide layer 15 which has different thicknesses on the drain side portion 15a and the source side portion 15b. Thus, the surface area of the floating gate 101 increases by the step as compared with the case where a silicide layer with a uniform thickness is formed. This can allow the gate coupling ratio to be increased. This is advantageous in that the writing and erasing characteristics of the floating gate type non-volatile semiconductor memory device can be improved.

A description will now be given of a method of forming silicide in a semiconductor device according to the third invention.

In the first step in the third invention, a first metal layer is formed on a conductive layer of silicon. The metal for the first metal layer is a silicide forming metal as has already been mentioned earlier in the description of the first embodiment. The first metal layer can be formed by a known thin film forming technology, such as sputtering or CVD.

Next, a reaction suppressing layer which suppresses a silicidation between silicon and metal is formed on the first metal layer. As has already been discussed in the description of the first embodiment, the reaction suppressing layer is formed of a material which causes no silicidation with silicon, or low-resistance material which may cause a silicidation but has a lower reactivity than the mentioned metal. One example of the material for the reaction suppressing layer is a metal nitride. This metal nitride may be a nitride of the aforementioned silicide forming metal. More specifically, the metal nitride is at least one kind selected from a group of titanium nitride, cobalt nitride, nickel nitride and tungsten nitride. When the reaction suppressing layer is formed of a metal nitride, this metal nitride should not necessarily be a nitride of the same metal as is used for the first metal layer. When the material for the reaction suppressing layer is a metal nitride, this layer is formed by CVD and sputtering.

Then, a second metal layer is formed on the reaction suppressing layer. The second metal layer, like the first metal layer, is formed of a silicide forming metal. The first metal layer and the second metal layer should not necessarily be formed of the same kind of metal.

A silicon layer is then formed on the second metal layer. The silicon layer is made of, for example, polysilicon or amorphous silicon.

Thereafter, the laminated structure which has the conductive layer, the first metal layer, the reaction suppressing layer, the second metal layer and the silicon Layer stacked in order is subjected to a heat treatment. This heat treatment causes a silicidation between the conductive layer and the first and between the second metal layer and the silicon layer. As a result, silicide is formed. At this time, the reaction suppressing layer is provided on the first metal layer and under the second metal layer. As mentioned above, the reaction suppressing layer is formed of a material which causes no silicidation with silicon, or a material which may cause a silicidation but has a lower reactivity than the metals which constitute the first metal layer and the second metal layer. The first metal layer and the second metal layer respectively react with the conductive layer and the silicon layer so that "silicidation progresses". After the first metal layer and the second metal layer are entirely silicided and used up, therefore, the silicidation stops at the reaction suppressing layer or gets considerably slow. When the first metal layer and the second metal layer are entirely silicided, therefore, the silicide layer does not become thicker anymore. Accordingly, the thickness of the silicide layer depends on the thicknesses of the first and second metal layers, but not the temperature nor time of the heat treatment when the silicidation is sufficiently performed.

As is apparent from the above, the thickness of the silicide layer can be controlled by changing the thicknesses of the first and second metal layers. By making the first and second metal layers thinner, for example, the silicide layer can be formed thinner. The silicide layer can be formed thicker by making the first and second metal layers thicker. The thicknesses of the first metal layer and the second metal layer may be set different from each other, so that silicide layers with different thicknesses can be formed above and below the reaction suppressing layer.

The method of forming a silicide layer in a semiconductor device according to the third invention, as described above, can independently optimize the thicknesses of the silicide layers which are formed by the reaction of the first metal layer with the conductive layer and the reaction of the second metal layer with the silicon layer.

According to the silicide layer forming method of the third invention, a low-resistance layer is formed by the silicide layers which are formed by the reaction of the first metal layer with the conductive layer and the reaction of the second metal layer with the silicon layer and the reaction suppressing layer. This will be explained below with reference to the salicide structure of an MOS transistor. In the case where the first metal layer is formed thin to prevent the silicide erosion of the impurity diffusion layer formed in the silicon substrate at the time the first metal layer, the reaction suppressing layer and the second metal layer are sequentially formed on the impurity conductive layer formed in the silicon substrate, even if the lower silicide layer becomes thinner, the whole three layers can sufficiently secure the effective thickness of the low-resistance layer as long as the reaction suppressing layer and the upper silicide layer are thick. It is therefore possible to sufficiently reduce the sheet resistance of the impurity diffusion layer and to prevent leakage at the pn junction.

With the reaction suppressing layer formed of a metal nitride, when the concentration of metal atoms in the metal nitride is relatively high (e.g., titanium (Ti)>50 atom %), the metal nitride is silicided though it has a lower reactivity than the metals for the first metal layer and the second metal layer. Therefore, the reaction suppressing layer formed of the metal nitride is silicided. Accordingly, the resistance of the reaction suppressing layer can be decreased further.

The reaction suppressing layer may selectively be formed on the conductive layer. The reaction suppressing layer is formed only on the area where a silicide layer should be formed thin on the silicon substrate. In the area on the conductive layer where the reaction suppressing layer is formed, therefore, the first metal layer alone is silicided to form a thin silicide layer as mentioned earlier. In the area where the reaction suppressing layer is not formed, a silicidation occurs not only between the first metal layer and the conductive layer but also between the second metal layer and the conductive layer, thereby forming a thick silicide layer. With regard to the upper silicon layer, likewise, a thin silicide layer is formed in the area where the reaction suppressing layer is formed and a thick silicide layer is formed in the are where the reaction suppressing layer is not formed.

The above-described method of forming a silicide layer in a semiconductor device according to the third invention can be adapted to the formation of a low-resistance layer which serves to reduce the contact resistance between the conductive layer of silicon and another conductive layer and the sheet resistance of the conductive layer. For example, this method can be adapted to the formation of a low-resistance layer which is formed between the silicon layer and the drain region of an MOS transistor and the upper conductive layer of silicon, or the formation of a low-resistance conductive layer in the so-called local interconnect in the CMOS technology.

Further, the method of forming a silicide layer according to the third invention can be adapted to the formation of a low-resistance layer which serves to reduce the contact resistance at the connecting portion for electrically connecting upper and lower interconnection layers of polysilicon, which are respectively located above and below with the interlayer insulator film in between in a semiconductor device having a multi-layered interconnection structure in addition to the formation of a low-resistance layer on an impurity diffusion layer.

A detailed description will now be given of a method of forming a silicide layer in a semiconductor device according to the fourth embodiment of the third invention, with reference to the accompanying drawings.

FIGS. 12A to 12E, FIGS. 13A and 13B and FIGS. 14A and 14B are cross-sectional views illustrating the individual steps of a semiconductor device fabricating method to which the third invention is adapted.

Figure 12A:
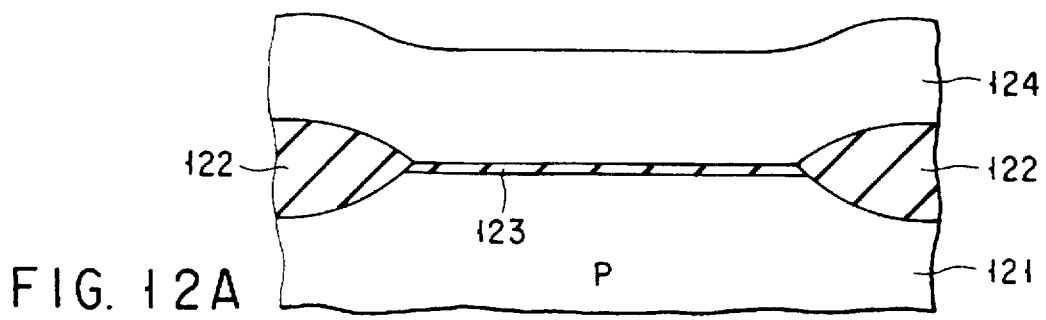
FIGS. 12A to 12E are cross-sectional views illustrating steps in a method of fabricating the semiconductor device according to the fourth embodiment.

In FIG. 12A, a field oxide 122 which is a device isolation region is selectively formed in a P type silicon substrate 121 by the LOCOS method. A gate oxide 123 with a thickness of, for example, 15 nm, is formed on the active region defined by the field oxide 122, by thermal oxidation.

Next, a polysilicon film 124 with a thickness of, for example, 300 nm is deposited on the gate oxide 123. Phosphorus (P) is doped as an impurity in the polysilicon film 124 by the gas phase diffusion method in order to improve the conductivity.

Figure 12B:
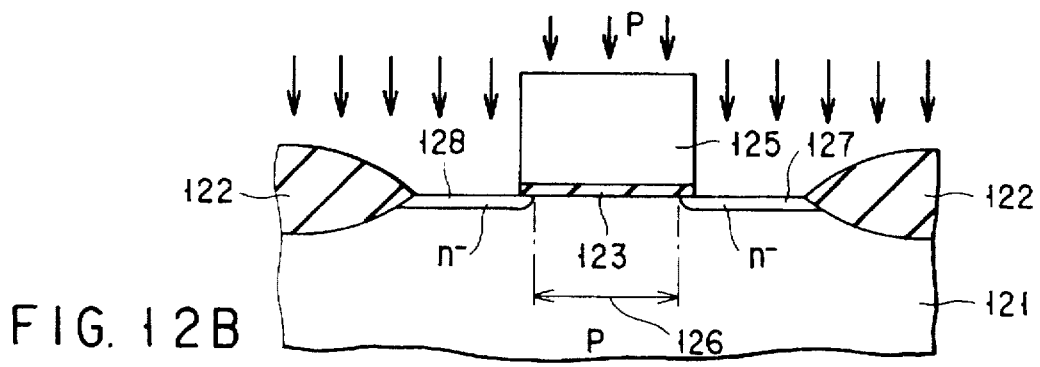

Then, a resist pattern (not shown) is formed on the polysilicon film 124, and RIE is performed on the resultant structure using hydrogen bromide gas and chlorine gas as etching gases to pattern the polysilicon film 124 and the exposed gate oxide 123 to pattern the polysilicon film 124 and the exposed gate oxide 123. Consequently, a gate electrode 125 is formed above a channel region 126 in the silicon substrate 121, as shown in FIG. 12B.

Then, P$^+$ions with a low concentration are injected into the silicon substrate 121 having the gate electrode 125 formed thereon, thus forming low concentrate impurity diffusion regions n$^-$127 and 128.

Figure 12C:
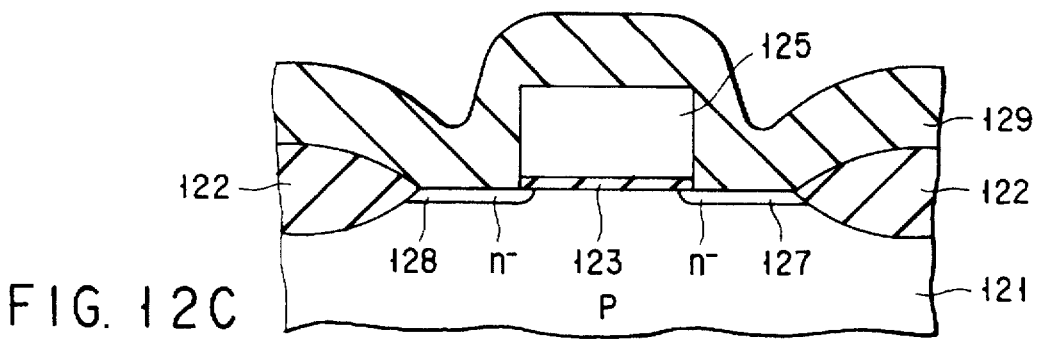
Figure 12D:
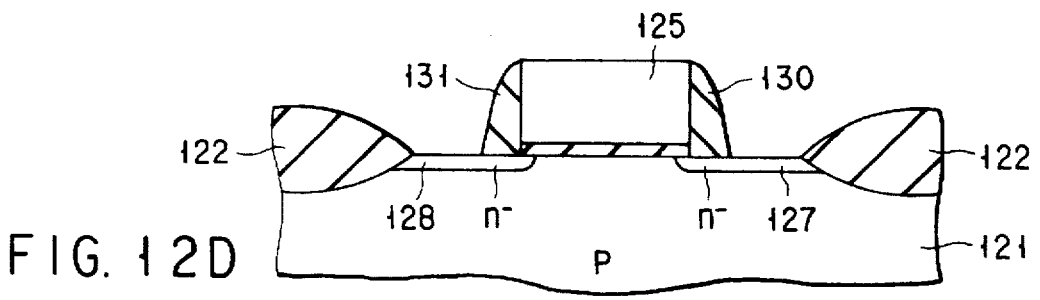

Next, a silicon oxide 129 is formed on the silicon substrate 121 by the CVD method and the silicon oxide 129 is etched by anisotropic RIE as shown in FIG. 12C. As a result, oxide spacers 130 and 131 are formed on the side portions of the gate electrode 125, as shown in FIG. 12D.

Figure 12E:
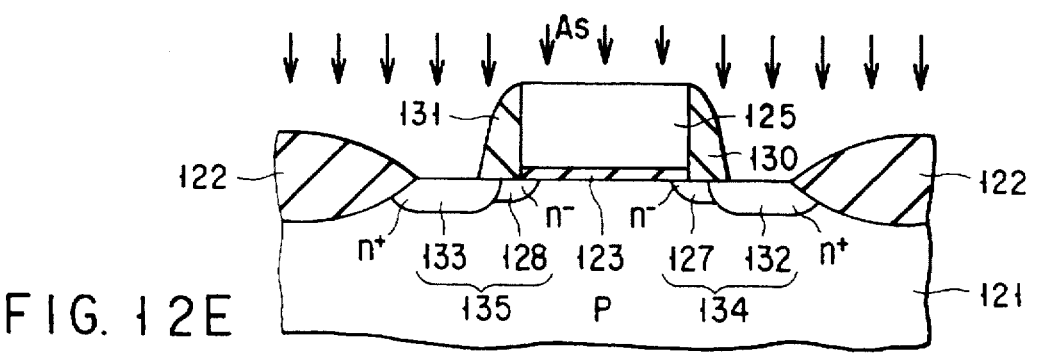

Then, as shown in FIG. 12E, As ions are injected at a high concentration into the exposed silicon substrate 121 to form high concentrate impurity diffusion regions n$^+$132 and 133, thereby forming a source region 134 and a drain region 135 with the so-called LDD structure.

As shown in FIG. 13A, a titanium layer 136 with a thickness of 50 nm or less, specifically 10 nm, is formed on the entire surface of the silicon substrate 121 including the source region 134, the drain region 135 and thus on the gate electrode 125 by CVD using sputtering. Then, a titanium nitride layer 137 with a thickness of 20 nm or less, preferably ranging from 0.5 to 20 nm, is formed as a reaction suppressing layer on the titanium layer 137 by reactive sputtering at the ratio of 0.5 to 3% by weight of $N_2$ and 97 to 99.5% by weight of Ar. Further, a titanium layer 138 with a thickness of 30 nm is likewise formed on the titanium nitride Layer 137 by sputtering. A polysilicon film 139 with a thickness of 75 nm is formed on the titanium layer 138 by CVD using a silane gas ($SiH_4$) as the source gas.

Then, a photoresist layer 140 is formed on the polysilicon film 139 and an opening 141 is formed in the gate electrode 125 according to the ordinary photolithographic process, as shown in FIG. 13B. With this photoresist layer 140 as a mask, the polysilicon film 139 is selectively etched to remove the polysilicon film 139 in the opening 141. After the etching, the photoresist layer 140 is removed.

Figure 14A:
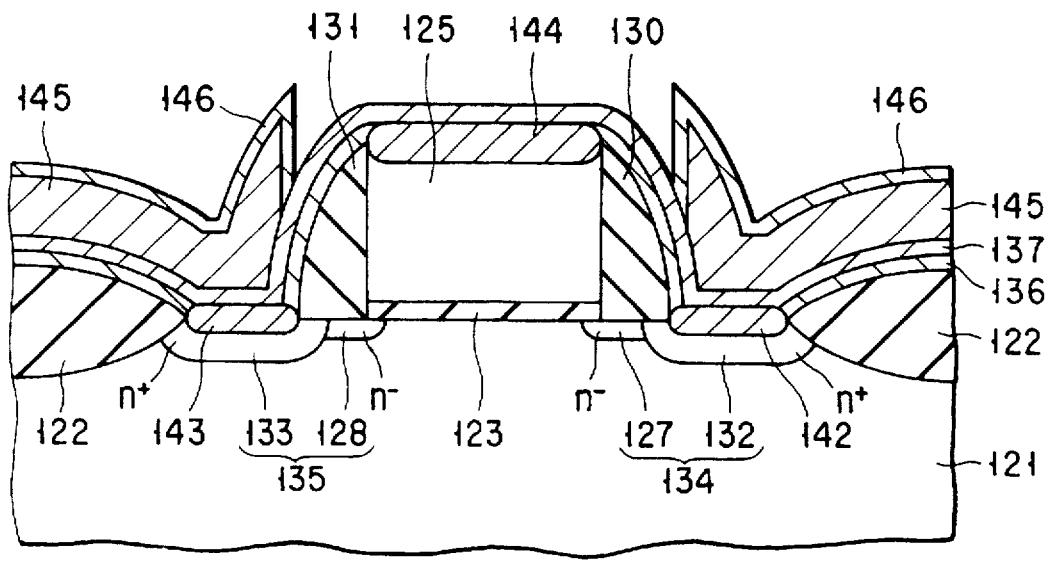
FIGS. 14A and 14B are cross-sectional views showing steps in the method of fabricating the semiconductor device according to the fourth embodiment.

After the photoresist layer 140 is removed, the silicon substrate 121 is subjected to a heat treatment. More specifically, RTN is performed under the nitrogen or ammonia environment. This heat treatment causes a silicidation to progress between the first titanium layer 136 and the source region 134, the drain region 135 and the gate electrode 125, forming silicide layers 142, 143 and 144, as shown in FIG. 14A. Further, a silicidation progresses between the second titanium layer 138 and the polysilicon film 139, thus forming a silicide layer 145. The surface of the silicide layer 145 is covered with a silicon nitride layer 146 which is formed by nitriding the polysilicon film 139. In this heat treatment, the titanium layer 138 located in the opening 141 shown in FIG. 13B is entirely nitrided to become integral with the titanium nitride layer 137.

Next, etching is performed with $NH_4OH$ to remove the non-reacted titanium layer 136 and titanium nitride layer 137. Thereafter, an interlayer insulator film, an upper interconnection layer, etc. are formed by the ordinary process to finally obtain a semiconductor device.

Figure 14B:
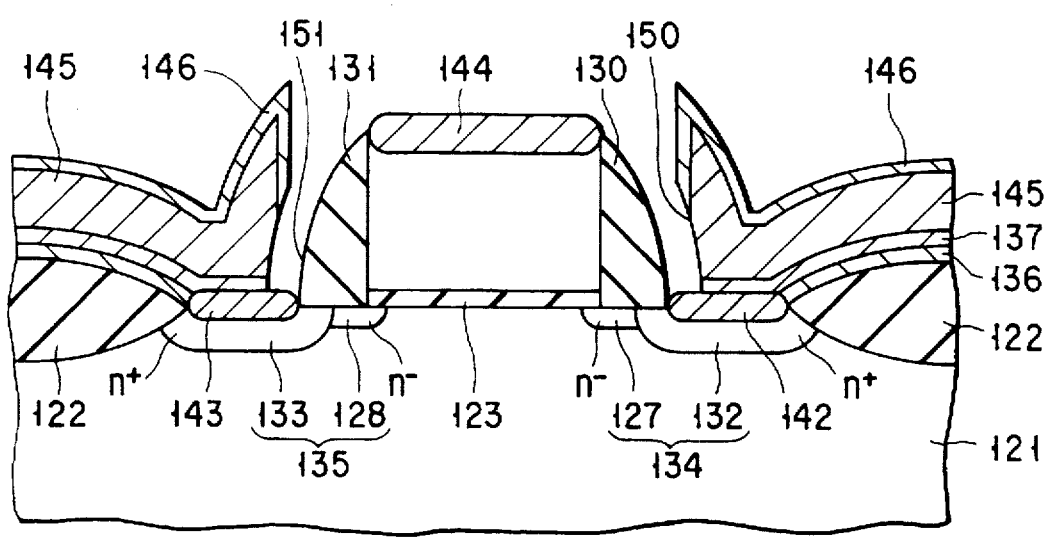

By removing the non-reacted titanium nitride layer 136, recesses 150 and 151 surrounded by the oxide space 130 and 131 and the silicide layer 145 are formed as shown in FIG. 14B. In the subsequent step of forming an interlayer insulator film, the interlayer insulator film is not formed deep inside the recesses 150 and 151 and remain as void portions. When void portions remain, water or a chemical liquid remains on the void portions so that corrosion of silicon or the like may occur. It is therefore preferable that the interlayer insulator film be formed to fill deep inside the recesses 150 and 151. Specifically, the interlayer insulator film can fill deep in the recesses 150 and 151 by forming the interlayer insulator film by plasma CVD at 350° to 450° C. or normal pressure CVD at 400° to 500° C. using, as the source gas, $SiH_4$, $Si_2H_6$ or the like for the non-doped oxide film, $SiH_4/PH_3$ or the like for PSG, $SiH_4/B_2H_6$ or the like for BSG, $SiH_4/PH_3/B_2H_6$ or the like for BPSG, or $SiH_4/AsH_3$ or the like for AsSG.

According to the silicide layer forming method in the semiconductor device fabricating process according to the fourth embodiment, as described above, to form a silicide layer through a heat treatment, the titanium nitride layer 137 is provided as a reaction suppressing layer above the first titanium layer 136 and below the second titanium layer 138.

The titanium nitride layer 137, when having a high concentration of nitrogen atoms, does not have a silicidation with silicon. Therefore, the first titanium layer 136 reacts with the source region 134 and the drain region 135 so that silicidation progresses. After the titanium layer 136 is entirely silicided and used up, however, the silicidation stops at the titanium nitride layer 137. If the titanium layer 136 is completely silicided, the silicide layers 142 and 143 do not become thicker. Moreover, the thicknesses of the silicide layers 142 and 143 depend on the thickness of the titanium layer 136, not the temperature and time of the heat treatment when the silicidation is sufficiently performed.

Figure 15:
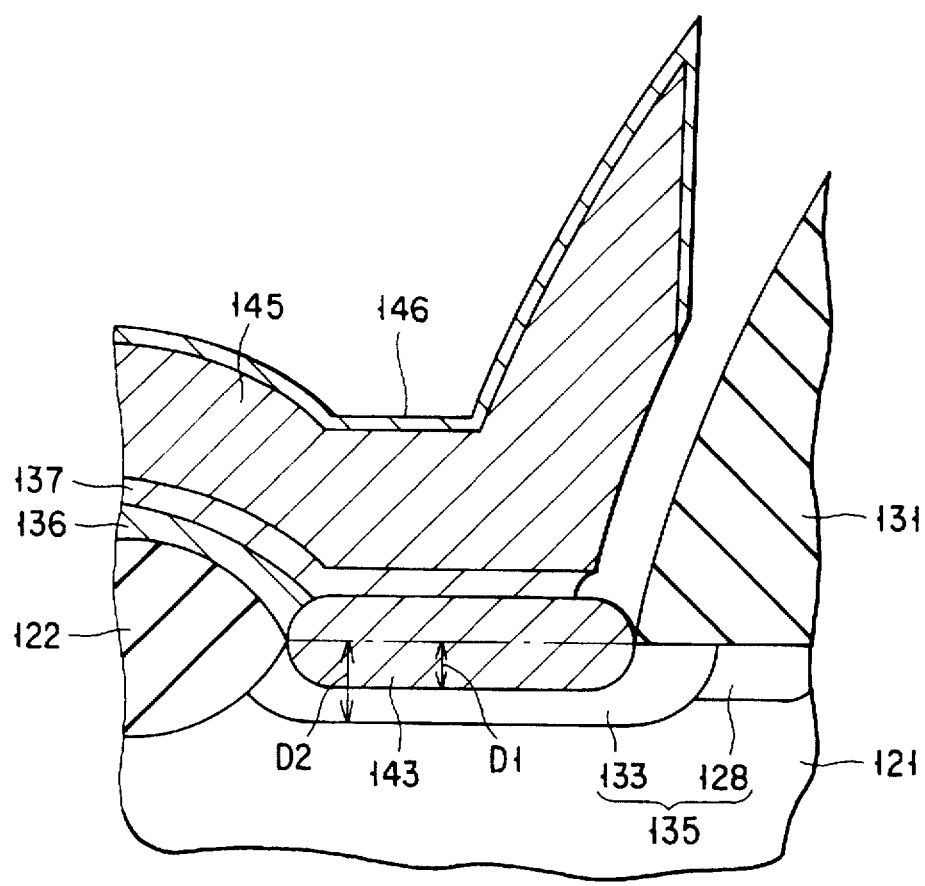
FIG. 15 is a cross-sectional view showing the essential portions of a semiconductor device which is fabricated by the fabrication method according to the fourth embodiment.

Since the thicknesses of the silicide layers 142 and 143 can be controlled by changing the thickness of the titanium layer 136, the depth $D_1$ (see FIG. 15) of silicide layers 142 and 143 formed on the source region 134 and the drain region 135 from the surface of the silicon substrate 121 can be optimized by properly setting the thickness of the titanium layer 136. Making the titanium layer 136 sufficiently thin can set the depth $D_1$ of silicide layers 142 and 143 shallow enough to cause no junction leakage at the source region 134 and the drain region 135. Specifically, the depth $D_1$ of silicide layers 142 and 143 can be suppressed down to the junction depth by setting the thickness of the titanium layer 136 to $D_2/2.25$ or less with respect to the depth $D_2$ of the source region 134 and the drain region 135. It is therefore possible to prevent junction leakage from occurring by overerosion silicon by of the silicide layers 142 and 143.

According to the silicide layer forming method according to the fourth embodiment, three layers consisting of the silicide layers 142 and 143, the silicon nitride layer 137 and the silicide layer 144 forms a low-resistance layer. In the case where silicide erosion of the source region 134 and the drain region 135 is prevented by forming the titanium layer 136 thin as mentioned above, the silicide layers 142 and 143 under the titanium nitride layer 127 become thin. However, the whole three layers can sufficiently secure the effective thickness of the low-resistance layer as long as the titanium nitride layer 137 and the upper silicide layer 144 are sufficiently thick. It is therefore possible to sufficiently reduce the sheet resistance and to prevent leakage at the pn junction in the semiconductor device.

When the concentration of the titanium atoms in the titanium nitride layer 137 is relatively high, the titanium nitride layer 137, which has a lower reactivity than the titanium layers 136 and 138, is silicided. Therefore, the titanium nitride layer 137 above the source region 134 and the drain region 135 is entirely silicided. Accordingly, the resistance of the low-resistance layer can be decreased further.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of fabricating a floating gate type non-volatile semiconductor memory device, comprising steps of:
   providing a first metal layer of a silicide forming metal, which is capable of forming silicide by reaction with silicon, over a surface of a silicon substrate having at least a source region, a drain region, a channel region disposed between the source and drain regions and a floating gate of silicon provided above the channel region;

providing a reaction suppressing layer on said first metal layer at least over said drain region and excluding over said source region, said reaction suppressing layer suppresses a silicidation;

providing a second metal layer of said silicide forming metal on said first metal layer and said reaction suppressing layer;

subjecting said silicon substrate to a heat treatment to form silicide layers respectively on said source region and said drain region by silicidations between said source region and said first and second metal layers and between said drain region and said first metal layer; and providing a control gate over the floating gate, an insulator film disposed between the floating and control gates.

2. The method according to claim 1, wherein said silicide forming metal is a refractory metal.

3. The method according to claim 2, wherein said refractory metal is at least one selected from a group of tungsten, cobalt, titanium and nickel.

4. The method according to claim 1, wherein said reaction suppressing layer is a metal nitride.

5. The method according to claim 1, wherein said reaction suppressing layer is a nitride of said silicide forming metal.

6. The method according to claim 4, wherein said metal nitride is at least one selected from a group of titanium nitride, cobalt nitride, nickel nitride and tungsten nitride.

7. The method according to claim 1, wherein said silicide layer formed on said source region has a different depth to said silicon substrate from a depth of said silicide layer on said drain region.

8. The method according to claim 7, wherein said depth of said silicide layer formed on said drain region to said silicon substrate is shallower than said depth of said silicide layer formed on said source region to said silicon substrate.

9. The method according to claim 1, wherein said first metal layer is provided on surfaces of said drain region, said floating gate and said source region.

10. The method according to claim 1, wherein said floating gate is made of silicon.

11. The method according to claim 10, wherein in said step of subjecting said silicon substrate to said heat treatment, a silicide layer is also formed on a surface of said floating gate by a silicidation between said floating gate and said first metal layer.

12. The method according to claim 1, wherein said reaction suppressing layer is provided on said first metal layer extending from said drain region to at least a part of a drain-region side surface of said floating gate.

13. The method according to claim 12, wherein said floating gate is made of silicon; and in said step of subjecting said silicon substrate to said heat treatment, one silicide layer is formed on a region on said surface of said floating gate, on which said first metal layer, said reaction suppressing layer and said second metal layer are formed, by a silicidation between said floating gate and said first metal layer and another silicide layer is formed on a region on said surface of said floating gate, on which said first metal layer and said second metal layer are formed, by a silicidation between said floating gate and said first and second metal layers.

14. The method according to claim 13, wherein a thickness of said one silicide layer differs from a thickness of said another silicide layer, and a step is formed between said one silicide layer and said another silicide layer.

15. A method of fabricating a floating gate type nonvolatile semiconductor memory device, comprising steps of:

forming a first metal layer of a silicide forming metal, which is capable of forming silicide by reaction with silicon, over a surface of a silicon layer as a floating gate provided above a channel region disposed between a source region and a drain region on a semiconductor substrate;

forming a reaction suppressing layer on a surface of said first metal layer, which lies above a part of a surface of said silicon layer, said suppressing layer suppresses a silicidation;

forming a second metal layer of said silicide forming metal on said first metal layer and said reaction suppressing layer;

subjecting said semiconductor substrate to a heat treatment to form a silicide layer having two regions of different thicknesses on said surface of said silicon layer by silicidations between said silicon layer and said first metal layer and between said silicon layer and said first and second metal layers;

removing an non-reacted portion of, if any, said second metal layer; and providing a control gate over said silicide layer, a gate insulator film being disposed between the control gate and the silicide layer.

16. The method according to claim 15, wherein said silicide forming metal is a refractory metal.

17. The method according to claim 16, wherein said refractory metal is at least one selected from a group of tungsten, cobalt, titanium and nickel.

18. The method according to claim 15, wherein said reaction suppressing layer is a metal nitride.

19. The method according to claim 18, wherein said reaction suppressing layer is a nitride of said silicide forming metal.

20. The method according to claim 18, wherein said metal nitride is at least one selected from a group of titanium nitride, cobalt nitride, nickel nitride and tungsten nitride.

21. The method according to claim 15, wherein said reaction suppressing layer is formed on said surface of said first metal layer, which lies above a drain side portion of said silicon layer.

22. The method according to claim 15, wherein said semiconductor substrate is a silicon substrate and said first metal layer is formed on surfaces of said drain region, said silicon layer and said source region.

23. The method according to claim 22, wherein said reaction suppressing layer is formed on said surface of said first metal layer which extends from above said drain region to above a drain side portion of said silicon layer, and silicide layer with different depths to said semiconductor substrate are formed on said drain region and said source region respectively in said step of subjecting said semiconductor substrate to said heat treatment.

24. The method according to claim 23, wherein said depth of said silicide layer formed on said drain region to said silicon substrate is shallower than said depth of said silicide layer formed on said source region to said silicon substrate.

25. A method of forming a silicide layer in a semiconductor device, comprising steps of:

forming a first metal layer of a silicide forming metal capable of forming silicide by reaction with silicon, on a conductive layer of silicon;

forming a reaction suppressing layer on said first metal layer for suppressing a silicidation;

forming a second metal layer of said silicide forming metal on said reaction suppressing layer;

forming a silicon layer on said second metal layer; and performing a heat treatment to form a silicide layer by silicidations between said conductive layer and said first metal layer and between said second metal layer and said silicon layer.

26. The method according to claim 25, wherein said conductive layer is an impurity diffusion layer formed in a silicon layer.

27. The method according to claim 25, wherein said silicide forming metal is a refractory metal.

28. The method according to claim 25, wherein said refractory metal is at least one selected from a group of tungsten, cobalt, titanium and nickel.

29. The method according to claim 25, wherein said reaction suppressing layer is a metal nitride.

30. The method according to claim 29, wherein said reaction suppressing layer is a nitride of said silicide forming metal.

31. The method according to claim 29, wherein said metal nitride is at least one selected from a group of titanium nitride, cobalt nitride, nickel nitride and tungsten nitride.

32. A method of fabricating a semiconductor device, comprising steps of:

forming a first metal layer of a silicide forming metal capable of forming silicide by reaction with silicon, on a silicon substrate having a source region and a drain region formed apart from each other in a major surface thereof and a gate electrode provided over a channel region disposed between said source region and said drain region;

forming a reaction suppressing layer on said first metal layer for suppressing a silicidation;

forming a second metal layer of said silicide forming metal on said reaction suppressing layer;

forming a silicon layer on said second metal layer; and subjecting said silicon substrate to a heat treatment to form a silicide layer by silicidations between said source and drain regions and said first metal layer and said second metal layer and said silicon layer.

33. The method according to claim 32, wherein said silicide forming metal is a refractory metal.

34. The method according to claim 33, wherein said refractory metal is at least one selected from a group of tungsten, cobalt, titanium and nickel.

35. The method according to claim 32, wherein said reaction suppressing layer is a metal nitride.

36. The method according to claim 33, wherein said reaction suppressing layer is a nitride of said silicide forming metal.

37. The method according to claim 35, wherein said metal nitride is at least one selected from a group of titanium nitride, cobalt nitride, nickel nitride and tungsten nitride.

* * * * *